US011315987B2

(12) United States Patent
Nakamura et al.

(10) Patent No.: US 11,315,987 B2
(45) Date of Patent: Apr. 26, 2022

(54) ELECTRONIC DEVICE

(71) Applicant: TOPPAN PRINTING CO., LTD., Taito-ku (JP)

(72) Inventors: Tsukasa Nakamura, Taito-ku (JP); Nozomi Onaka, Taito-ku (JP); Kenzo Fukuyoshi, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 99 days.

(21) Appl. No.: 16/927,365

(22) Filed: Jul. 13, 2020

(65) Prior Publication Data
US 2020/0343314 A1  Oct. 29, 2020

Related U.S. Application Data

(63) Continuation of application No. PCT/JP2018/000748, filed on Jan. 15, 2018.

(51) Int. Cl.
*H01L 27/32* (2006.01)
*H01L 51/52* (2006.01)
(Continued)

(52) U.S. Cl.
CPC .............. *H01L 27/323* (2013.01); *G06F 1/18* (2013.01); *G06F 1/26* (2013.01); *G06F 3/044* (2013.01);
(Continued)

(58) Field of Classification Search
CPC ........ G06F 1/1637; G06F 1/1698; G06F 1/18; G06F 1/26; G06F 3/0412; G06F 3/044;
(Continued)

(56) References Cited

U.S. PATENT DOCUMENTS 7,973,722 B1 * 7/2011 Hill .......................... H01Q 1/24
343/702
10,431,872 B1 * 10/2019 Kim ..................... H04M 1/0202
(Continued)

FOREIGN PATENT DOCUMENTS

JP     2009-020140 A    1/2009
JP       3171994 U     11/2011
(Continued)

OTHER PUBLICATIONS

International Search Report dated Mar. 20, 2018 in PCT/JP2018/000748, filed Jan. 15, 2018 (with English translation).

*Primary Examiner* — Kwin Xie
(74) *Attorney, Agent, or Firm* — Oblon, McClelland, Maier & Neustadt, L.L.P.

(57) ABSTRACT

An electronic device includes first, second and third substrates positioned in this order when viewed in an observation direction, antenna units including first, second, third, and fourth antenna units formed such that the first and second antenna units are positioned on opposite sides of the second substrate and superposed on each other in the plan view, and that the third and fourth antenna units are positioned on the opposite sides of the second substrate and superposed on each other in the plan view, a display functional layer formed between the first and second substrates, a touch sensing functional layer formed between the first and second substrates, and including a capacitive touch sensing wiring unit and the first antenna unit, and a controller which is formed on the third substrate and controls a touch sensing function, a display function, a communication function, and a wireless charging function of the device.

12 Claims, 22 Drawing Sheets

(51) Int. Cl.
*G06F 1/18* (2006.01)
*G06F 1/26* (2006.01)
*G06F 3/041* (2006.01)
*G06F 3/044* (2006.01)
*H01Q 1/24* (2006.01)

(52) U.S. Cl.
CPC ........ *G06F 3/0412* (2013.01); *H01L 27/3276* (2013.01); *H01L 51/5284* (2013.01); *H01Q 1/243* (2013.01)

(58) Field of Classification Search
CPC ............. H01L 27/3276; H01L 51/5284; H01L 27/323; H01Q 1/2208; H01Q 1/243; H01Q 1/38; H01Q 21/06; H01Q 7/00
See application file for complete search history.

(56) References Cited

U.S. PATENT DOCUMENTS

| | | | | |
|---|---|---|---|---|
| 2017/0285844 A1* | 10/2017 | Park | ...................... | G06F 1/1643 |
| 2017/0287992 A1* | 10/2017 | Kwak | ................. | H04M 1/0264 |
| 2018/0261921 A1* | 9/2018 | Ha | ...................... | H04M 1/0277 |
| 2019/0027802 A1* | 1/2019 | Noori | ...................... | H01Q 3/30 |
| 2019/0027838 A1* | 1/2019 | Paulotto | ................. | H01Q 21/28 |

FOREIGN PATENT DOCUMENTS

| | | |
|---|---|---|
| JP | 2016-110075 A | 6/2016 |
| JP | 6020571 B2 | 11/2016 |
| JP | 2016-540257 A | 12/2016 |
| WO | WO 2013/011709 A1 | 1/2013 |

* cited by examiner

ELECTRONIC DEVICE

CROSS-REFERENCE TO RELATED APPLICATIONS

The present application is a continuation of International Application No. PCT/JP2018/000748, filed Jan. 15, 2018, the entire contents of which are incorporated herein by reference.

BACKGROUND OF THE INVENTION

Field of the Invention

The present invention relates to an electronic device having a display unit, and which is capable of touch sensing and wireless charging.

Discussion of the Background

Display devices such as smartphones and tablets having a capacitive touch sensing function, which allow direct finger or pointer input on a display screen, are becoming common. Known touch sensing functions use an on-cell method or an in-cell method. In the former method, a touch panel is attached on the surface of a liquid crystal, an organic EL (organic electroluminescence) or other display, while in the latter method, a liquid crystal or organic EL display device has a built-in touch sensing function. In recent years, there has been a shift from the on-cell method to the in-cell method.

Known touch sensing methods include a self-capacitive touch sensing method and a mutual capacitive touch sensing method. The self-capacitive touch sensing method is a method of detecting a capacitance of each electrode by using individual electrode patterns of ITO transparent conductive electrodes or the like, which are electrically independent from each other. The mutual capacitive touch sensing method is a method of detecting a capacitance between X direction wiring and Y direction wiring, which are formed by arranging a plurality of pieces of touch sensing wiring (hereinafter, simply referred to as "touch wiring") in the X direction and the Y direction.

Unlike a touch panel externally attached to a display apparatus, the in-cell method involves a structure in which touch wiring is formed at a position close to a display functional layer such as a liquid crystal layer. The in-cell method, which does not require a member such as a touch panel, can be used to provide thin and light display apparatuses and electronic devices. In the in-cell method, the touch wiring is formed at a position close to a display functional layer such as a liquid crystal layer, so a parasitic capacitance is likely to occur between the wiring such as gate wiring and source wiring, which constitute the thin film transistor configured to drive the display functional layer, and the touch wiring. Accordingly, the S/N ratio of touch sensing (hereinafter, touch) tends to be reduced. In order to reduce the parasitic capacitance, it is preferred to ensure a spatial distance between the surface on which the touch wiring is formed and the surface on which the gate wiring and the source wiring are formed. A configuration that ensures such a spatial distance is disclosed in PTL 1. Further, as shown in FIGS. 12 and 13 of PTL 2, a display substrate 22 having a touch sensing function and an array substrate 23 including a thin film transistor are spatially separated from each other by a liquid crystal layer 24. PTL 2 also discloses a technique for forming metal touch wiring mainly using copper alloys.

In the configuration disclosed in PTL 1, a terminal portion 61 having a plurality of pieces of metal touch wiring (corresponding to the first touch sensing wiring) provided on the display substrate 22 and a terminal portion having a plurality of transparent electrode patterns (corresponding to the second touch sensing wiring) provided on the display substrate 22 are electrically connected to connection terminals located on a liquid crystal sealing portion of an array substrate. However, to promote enlargement of an effective display region, a frame region constituting the liquid crystal sealing portion of the array substrate is formed to be narrow (narrowed frame). Therefore, it is quite difficult to completely electrical connect the terminal portions of the metal touch wiring and the transparent electrode pattern via the liquid crystal sealing portion.

When conductive particles such as metal balls and gold beads are used to electrically connect the terminal portions to connection terminals of the liquid crystal sealing portion of the array substrate, it is difficult to connect electrically between several hundreds or thousands of fine terminal portions to the connection terminals of the facing substrate (array substrate) via the liquid crystal sealing portion uniformly in a thickness direction thereof. Extending the substrate to use an FPC or other flexible circuit board can provide electrical connection only on the side where the terminal portion of the display device is present, but such a conductive structure fails to provide a narrow frame. In recent years, the width of a light-shielding frame region provided around the effective display region of the display device is required to be as narrow as 5 mm or less. The narrowed frame or the narrow frame structure means a display device in which the effective display region is expanded by narrowing the width of the frame region.

To make it realize pen touch input, finger touch input or fingerprint authentication, it requires touch wiring with higher density, which spread to the X-direction and Y-direction. In this case, the number of pixels is required to be similar to that of a high-definition liquid crystal display device, for example 2400×1200 pixels. Further, in order to enable a touch screen capable of touch input with a pen as described above, a structure is required in which the wiring density of a plurality of pieces of touch wiring extending in both the X direction and the Y direction is increased. In addition, a structure applicable to the above narrow frame structure is also required. Further, PTL does not disclose any method for charging a portable display device or electronic device.

For a portable display apparatus or electronic device, wireless charging has been demanded since charging from a 100V external power supply is inconvenient. Further, in most mobile devices such as smartphones and tablet terminals, a touch sensing function with a finger or other pointers as well as a communication function is becoming essential.

PTL 2 discloses a configuration in which a planar antenna is provided on the outer periphery of a transparent touch sensor. The paragraph [0006] of PTL 2 describes that the antenna and the touch sensor are integrally formed to contribute to space saving in the display housing.

PTL 3 discloses an electronic part 110 embedded in a ceramic layer as described in the paragraph [0017], and further describes that the electronic part 110 may include one or more antennas as described in the paragraph [0020]. PTL 3 does not provide sufficient description on the shape of the antennas.

PTL 4 discloses a configuration including a light emitting panel, a secondary battery, a circuit having an antenna, and a sealing member. PTL 4 describes in claim 2 that the antenna is partially located between the light emitting panel and the secondary battery. The paragraph [0043] of PTL 4 describes that the secondary battery is charged wirelessly (in a wireless manner).

PTL 5 discloses a configuration including a first antenna of a helical shape and a second antenna of a volute shape, and further discloses a technique for preventing interference between a plurality of antennas by using an annular first magnetic sheet and a planar second magnetic sheet.

PTL 6 discloses a configuration of a typical display device including a light emitting layer using organic EL, for example, as shown in FIG. 2 and the like. When a light emitting element (light emitting layer) such as an organic EL element or LED (light emitting diode) is used, electrode materials having high reflectance, such as aluminum and silver, are used for a pixel electrode (in PTL 6, referred to as an optically reflective layer). Even when the power supply of the display device having such a configuration is off (and when the power supply is on as well), external light such as room light is reflected by the pixel electrode, which causes the display clarity to be reduced. In order to prevent such external light reflection, a circularly polarizing plate (in PTL 6, antireflection member) is attached to the surface of the display device. For the circularly polarizing plate, a resin substrate is used. Accordingly, in order to prevent scratches caused by contact with a pointer such as a pen or a finger during touch sensing input, a protective substrate such as a cover glass is typically provided on the outermost surface of the display device. The cover glass, which requires high strength, has a high density of approximately 2.4 g/cm$^3$. For example, a cover glass having a thickness in a range of approximately 1 mm to 0.7 mm has a weight of approximately 20 g for a display device with a screen size of approximately 6 inches. Accordingly, the display device having the above cover glass has increased weight and thickness.

PTL 7 discloses an electronic device having a planar antenna on the outer surface of the display device having a conductive housing.

None of PTLs 1 to 7 describe a technique for performing a touch sensing function and a display function by using transmission and reception of a signal performed in each of a plurality of antenna units individually, and power supply performed in each of a plurality of antenna units individually, details of which will be described later.

PTL 1: JP 6020571 B
PTL 2: JP 3171994 U
PTL 3: JP 2016-540257 T
PTL 4: JP 2016-110075 A
PTL 5: WO 2013/011709
PTL 6: JP 2009-20140 A
PTL 7: U.S. Pat. No. 7,973,722 B

SUMMARY OF THE INVENTION

According to an aspect of the present invention, an electronic device including a device body including plural substrates including a first substrate, a second substrate, and a third substrate positioned in an order thereof when viewed in an observation direction, plural antenna units including a first antenna unit, a second antenna unit, a third antenna unit, and a fourth antenna unit formed such that the first antenna unit and the second antenna unit are positioned on opposite sides of the second substrate and superposed on each other in the plan view when viewed in the observation direction, and that the third antenna unit and the fourth antenna unit are positioned on the opposite sides of the second substrate and superposed on each other in the plan view when viewed in the observation direction, a display functional layer formed between the first and second substrates, a touch sensing functional layer formed between the first and second substrates, and including a capacitive touch sensing wiring unit and the first antenna unit, and a controller which is formed on the third substrate and controls a touch sensing function, a display function, a communication function, and a wireless charging function of the device body. The first substrate is configured to transmit visible light. The second substrate has a thin film transistor array configured to drive the display functional layer, and has the third antenna unit on a surface thereof. The third substrate has a loop antenna, the second antenna unit, and the fourth antenna unit on a surface thereof such that the loop antenna provides the communication function between an outside and an inside of the electronic device and the wireless charging function from the outside of the electronic device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
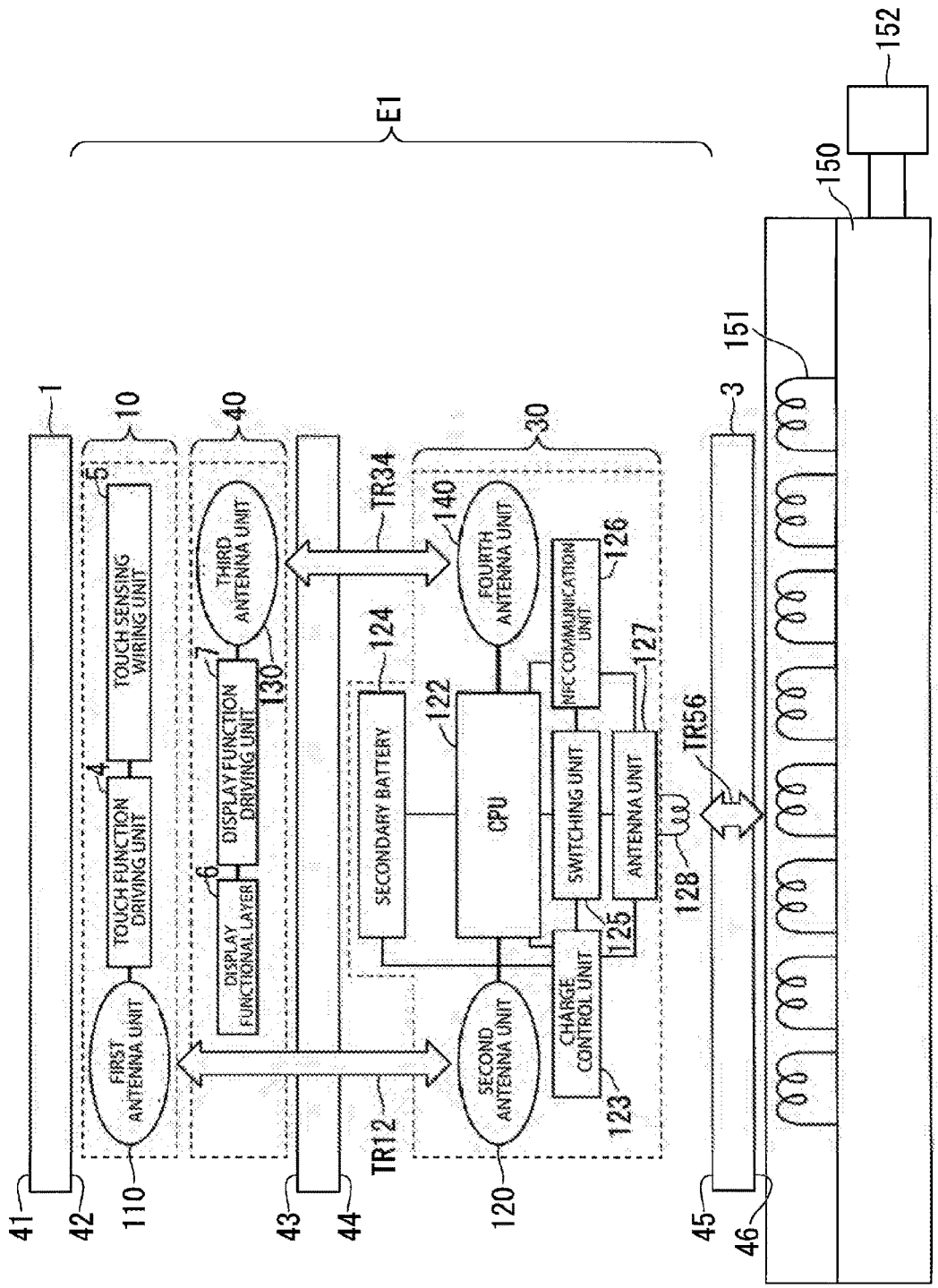
FIG. 1 is a block diagram of a configuration of an electronic device according to a first embodiment of the present invention, illustrating a positional relationship among a first substrate, a second substrate, and a third substrate in the electronic device, and a touch sensing unit, a display unit, a system control unit, and the like that constitute the electronic device.

The embodiments will now be described with reference to the accompanying drawings, wherein like reference numerals designate corresponding or identical elements throughout the various drawings.

With reference to the drawings, embodiments of the present invention will be described.

In the following description, identical or substantially identical functions and components are indicated by identical reference signs, and the description thereof will be omitted or simplified, or will be given only when necessary. Throughout the drawings, in order to illustrate the components at a recognizable size, the dimensions and proportions of the components are modified as appropriate. Components difficult to illustrate, for example, a configuration of a plurality of layers constituting a channel layer of a semiconductor, a configuration of a plurality of layers constituting a conductive layer, and the like are entirely or partially omitted as necessary. Further, for ease of understanding of the description of embodiments of the present invention, illustration of electric circuit elements, display functional layer, and the like may be simplified.

In the embodiments described below, only characteristic parts of an electronic device of the present embodiments will be described, and description of parts that are not different from components used in common electronic devices may be omitted.

The electronic device according to the embodiments of the present invention includes communication terminals such as smartphones, tablet terminals, and notebook PCs, wearable terminals such as smart watches and smart glasses, cameras, game devices, and information media having a communication function such as IC cards and memory cards provided with a display section. Further, electronic devices having a display function such as a display for TVs and advertising media, and having a capacitive input function, are also included. These electronic devices preferably have a wireless charging function for convenience of carrying and handling.

In the following description, conductive wiring, electrode, and signals that are involved in touch sensing may also be simply referred to as touch sensing wiring, touch driving wiring, touch detection wiring, touch wiring, touch electrode, and touch signals. A voltage applied to the touch sensing wiring to drive touch sensing is referred to as a touch driving voltage. A touch sensing wiring unit includes a plurality of pieces of first conductive wiring (first touch wiring) parallel to each other and a plurality pieces of second conductive wiring (second touch wiring) parallel to each other with an insulating layer therebetween. The first conductive wiring and the second conductive wiring may also be hereinafter simply referred to as conductive wiring or touch wiring. For example, a drive control unit related to touch sensing may be abbreviated as a touch driving control unit. The first conductive wiring and the second conductive wiring are perpendicular to each other in plan view.

In the following description, "plan view" means "plan view in the observation direction in which the electronic device is viewed by the observer." Alternatively, a view in an observer direction (a direction in which the electronic device is viewed by an observer P) may also be simply referred to as a plan view.

Ordinal numerals such as "first" and "second", as in a first substrate, a second substrate, first wiring, second wiring, third wiring, a first conductive metal oxide layer, and a second conductive metal oxide layer, are given to avoid confusion of components, and do not limit quantity thereof. Further, the first conductive metal oxide layer and the second conductive metal oxide layer may also be hereinafter simply referred to as a conductive metal oxide layer.

A first antenna unit, a second antenna unit, a third antenna unit, and a fourth antenna unit of an electronic device according to the embodiments of the present invention are collectively referred to as an antenna unit.

A display functional layer of an electronic device according to the embodiments of the present invention may include a plurality of light emitting diode elements called LEDs (light emitting diodes), a plurality of organic EL (organic electroluminescent) elements called OLEDs, and a liquid crystal layer.

The organic EL element is a display functional layer made of an organic material, in which, when an electric field is applied between a pair of electrodes, holes injected from an anode (e.g., upper electrode) and electrons injected from a cathode (e.g., lower electrode, pixel electrode) are recombined with each other and excited to emit light in pixel units. The display functional layer using organic EL includes a luminescent material and preferably an electron-transporting material. The light emitting layer is a layer formed between the anode and the cathode. When a hole injection layer is formed on the upper side of the lower electrode (anode), the light emitting layer is formed between the hole injection layer and the upper electrode (cathode). Further, when a hole-transporting layer is formed on the upper side of the anode, the light emitting layer is formed between the hole-transporting layer and the cathode. Roles of the upper electrode and the lower electrode can be exchanged with each other.

The LED has the same electrode structure as that of the organic EL element, and the LED (display functional layer, light emitting layer) is driven in the same manner as the organic EL element. The LED may have a single layer or a multilayer configuration of a compound semiconductor such as indium gallium nitride (InGaN), gallium nitride (GaN), aluminum gallium nitride (AlGaN), aluminum gallium arsenide (AlGaAs), gallium arsenide phosphorus (GaAsP), and gallium phosphide (GaP). As described later, the above compound semiconductor often have a structure in which an n-type semiconductor layer/a light emitting layer/a p-type semiconductor layer are stacked. For the electrode structure of LED, a structure is known in which an anode and a cathode are arranged on one side of the layer configuration, in other words, a horizontal light emitting diode, in which these electrodes are arranged in the horizontal direction. Further, a vertical light emitting diode is known in which an upper electrode/an n-type semiconductor layer/a light emitting layer/a p-type semiconductor layer/a lower electrode are vertically stacked in the thickness direction. As described above, the light emitting layer of LED is made of an inorganic material.

The substrate is not limited to a transparent substrate. For example, a glass substrate, a quartz (including an artificial quartz) substrate, a sapphire substrate, a ceramic substrate, and the like can be used as a first substrate, a second substrate, and a third substrate. The second substrate and the third substrate may be transparent, or may be opaque or colored. Resin substrates of polyimide, polyether sulfone, polyether ether ketone, polytetrafluoroethylene, polyamide, polycarbonate, and the like can also be used.

However, for a display surface of an electronic device without a heavy cover glass, a substrate is required to have hardness in consideration of pen input using a metal tipped pen. In general, the substrate needs to have hardness similar to that of an iron pen, for example, a Mohs hardness of 5.5 or more. Since the Mohs hardness of diamond is defined as 10, the substrate needs to have a Mohs hardness in the range of 6 to 10.

A typical thickness of the cover glass is in the range of 1 mm to 0.5 mm. Accordingly, when the first substrate of the electronic device according to the embodiments of the present invention has a thickness in the range of 1 mm to 0.5 mm, the same strength as that of a cover glass can be imparted to the first substrate. When the thickness of the third substrate of the electronic device according to the embodiments of the present invention is in the range of 1 mm to 0.5 mm as with the first substrate, the strength required for a mobile device can be imparted even in a configuration which does not have a cover glass. When the first substrate and the third substrate have the same thickness, and are made of the same material, the strength required for an electronic device can be readily imparted. From the viewpoint of weight reduction, the thickness of the second substrate can be smaller than those of the first substrate and the third substrate. The thickness of the second substrate can be, for example, in the range of 0.4 mm to 0.1 mm.

In view of alignment in high-definition display, linear expansion coefficients of the first substrate, the second substrate, and the third substrate are preferably in the range of, for example, $10 \times 10^{-6}/°$ C. to $5 \times 10^{-6}/°$ C. By using a substrate having a Mohs hardness in a range of 6 to 10 and a thickness in a range of 1 mm to 0.5 mm as the first substrate and the third substrate, a light-weighted electronic device can be provided, for example, by omitting a cover glass. The first substrate and the third substrate may have a thickness larger than 1 mm.

Taking into consideration that light emitting elements such as an LED and an organic EL element require heat dissipation from the electronic device, it is desired that the substrate for use in the electronic device has a thermal conductivity $\kappa$ (W/m·K) larger than 1 in order to prevent heat accumulation. While a typical glass substrate has a thermal conductivity approximately in a range of 0.5 to 0.8 W/m·K, it is preferred to use a tempered glass, quartz substrate, sapphire glass, or the like having a thermal conductivity higher than this range as the substrate for use in the electronic device according to the embodiments of the present invention. Tempered glass has a hardness of approximately 6 to 7 on the Mohs scale, a quartz substrate has a hardness of 7 on the Mohs scale, and sapphire glass has a hardness of 9 on the Mohs scale.

Preferably, wiring including copper wiring or copper alloy wiring having good thermal conductivity are used for wiring formed on the substrate for use in the electronic device according to the embodiments of the present invention, for example, wiring such as the first conductive wiring, second conductive wiring, source wiring for driving a thin film transistor, gate wiring, power supply line, and antenna. A metal layer having good thermal conductivity or a light absorbing layer having good thermal conductivity is preferably included in a configuration of a conductive shield layer on a fourth surface of the second substrate that forms a light emitting element (light emitting diode element) such as LED or organic EL element.

First Embodiment (Functional Configuration of Electronic Device)

With reference to FIGS. 1 to 18, an electronic device E1 according to a first embodiment of the present invention will be described. In the electronic device E1 according to the first embodiment, a plurality of light emitting diode elements called micro LEDs are used for a display functional layer. For example, red light emitting diode elements, green light emitting diode elements, and blue light emitting diode elements are arranged in a matrix on a thin film transistor array to form a display unit.

FIG. 1 is a block diagram of the electronic device E1 according to the first embodiment of the present invention. As shown in FIG. 1, the electronic device E1 according to the present embodiment includes a touch sensing unit 10, a display unit 40, and a system control unit 30 (control unit).

(Touch Sensing Unit)

The touch sensing unit 10 (touch sensing functional layer) includes a first antenna unit 110, a touch function driving unit 4, and a touch sensing wiring unit 5. The first antenna unit 110 and the touch sensing wiring unit 5 are electrically connected to the touch function driving unit 4. In the touch sensing unit 10, the touch function driving unit 4 controls the touch sensing function (for example, a capacitive touch sensing function) by using the touch sensing wiring unit 5.

The first antenna unit 110, the touch function driving unit 4, and the touch sensing wiring unit 5 are disposed on a second surface 42 of a first substrate 1, which is described later. The first antenna unit 110 is superposed on a second antenna unit 120 disposed on a third substrate 3, which is described later, in plan view as viewed by the observer.

(Display Unit)

The display unit 40 is disposed between the second surface 42 of the first substrate 1 and a third surface 43 of a second substrate 2, described later, and includes a display functional layer 6, a display function driving unit 7, and a third antenna unit 130. The third antenna unit 130 and the display functional layer 6 are electrically connected to the display function driving unit 7. In the display unit 40, the display function driving unit 7 (thin film transistor array) controls the display functional layer 6.

The display functional layer 6, the display function driving unit 7, and the third antenna unit 130 are disposed on the third surface 43 of the second substrate 2, described later. As described above, the display functional layer 6 is composed of a plurality of light emitting diode elements and a thin film transistor array. The third antenna unit 130 is superposed on a fourth antenna unit 140 disposed on the third substrate 3 in plan view as viewed by the observer.

(System Control Unit)

The system control unit 30 includes a CPU (central processing unit) 122, a charge control unit 123, a switching unit 125, an NFC communication (near field communication) unit 126, an antenna unit 127, a second antenna unit 120, a fourth antenna unit 140, and a secondary battery 124. Further, as described above, the secondary battery 124 is provided at a position adjacent to the system control unit 30.

The CPU 122 is electrically connected to the secondary battery 124, the second antenna unit 120, the fourth antenna unit 140, the charge control unit 123, the switching unit 125, and the NFC communication unit 126. The charge control unit 123 and the NFC communication unit 126 are electrically connected to the switching unit 125. The antenna unit 127 is electrically connected to the charge control unit 123, the switching unit 125, and the NFC communication unit 126.

The system control unit 30 controls a touch sensing function in the touch sensing unit 10, a display function in the display unit 40, a communication function, and a wireless charging function. As indicated by the arrow designated as TR12, the system control unit 30 transmits and receives various signals related to touch sensing in a wireless manner between the touch sensing unit 10 and the system control unit 30 via the first antenna unit 110 and the second antenna unit 120, and supplies and receives power required for touch sensing in a wireless manner. As indicated by the arrow designated as TR34, the system control unit 30 transmits and receives various signals related to driving of the display functional layer in a wireless manner between the display unit 40 and the system control unit 30 via the third antenna unit 130 and the fourth antenna unit 140, and supplies and receives power required for driving touch sensing of the display functional layer in a wireless manner.

As indicated by the arrow designated as TR56, the charge control unit 123 receives power supplied from an external power supply (in FIG. 1, an AC adapter 152 or a cradle 150) such as 100V, via a loop antenna 128 constituting the antenna unit 127. The charge control unit 123 has a rectifying function and a function of monitoring a voltage of the secondary battery 124, and supplies power from the charge control unit 123 to the secondary battery 124 for charging. The secondary battery 124 is provided with a temperature sensor. When the charge control unit 123 detects an abnormal temperature, the charge control unit 123 stops supplying and receiving power to and from the secondary battery 124.

The antenna unit 127 includes the loop antenna 128, and has a function of adjusting a capacitance and a coil length of the loop antenna 128 used for resonance. The switching unit 125 receives a signal from the system control unit 30, and switches between a power receiving function and a near field communication (NFC communication) function of the antenna unit 127. The loop antenna 128 has a communication function between the outside and the inside of the electronic device E1, and a wireless charging function from the outside of the electronic device E1.

In power reception by the antenna unit 127, a frequency based on the Qi standard can be used. For example, a frequency in a range of 100 KHz to 200 KHz can be used. Alternatively, power reception by the antenna unit 127 can comply with a future expected international standard of wireless charging. A resonance frequency of near field communication using the antenna unit 127 can be, for example, 13.56 MHz or higher. The near field communication is controlled by the NFC communication unit 126. The NFC communication unit 126 has a modulation and demodulation function for performing near field communication.

(External Power Supply)

The cradle 150 shown in FIG. 1 has a function of charging the electronic device E1, a portable terminal such as a smartphone, or a wearable device according to the first embodiment of the present invention, and serves as a power supply unit. The cradle 150 includes a plurality of power supply antennas 151 of an electromagnetic induction type such that the electronic device E1 can receive power from one or more antennas 151 in a wireless manner. The cradle 150 has an antenna switching unit that selects any of the plurality of power supply antennas 151. The cradle 150 is connected to, for example, an external power supply such as 100V or 220V via an AC adapter 152.

(First Substrate)

Figure 2:
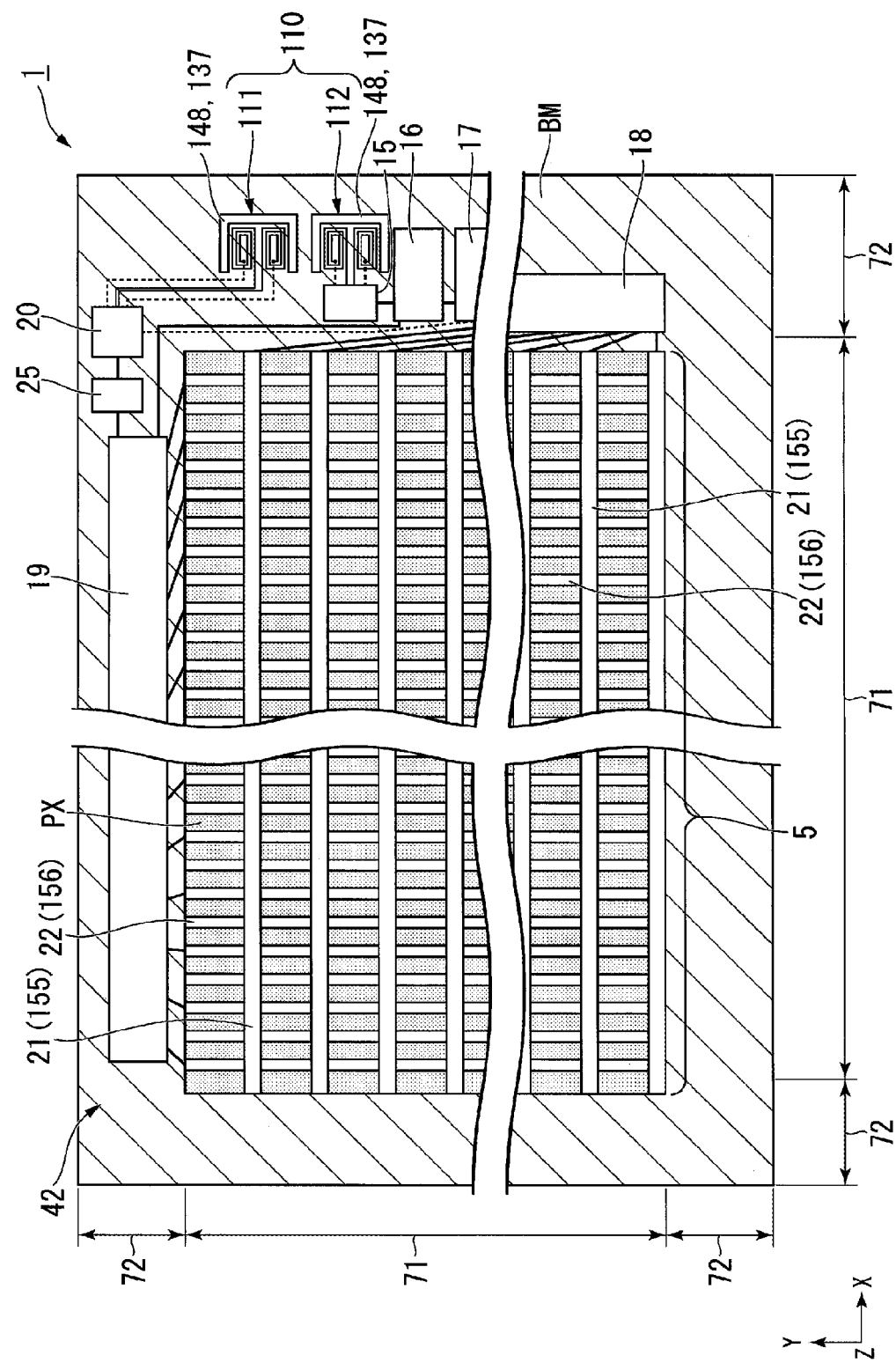
FIG. 2 is a plan view of the first substrate included in the electronic device according to the first embodiment of the present invention as viewed in an observation direction.

FIG. 2 is a plan view illustrating the first substrate 1 constituting the electronic device E1. While FIG. 2 is a plan view of the first substrate as viewed by the observer, a light-shielding black matrix is illustrated as transparent to show components provided on the first substrate.

The first substrate 1 is a light-transmitting transparent substrate that transmits light in the visible wavelength range, and made of a known material. As shown in FIG. 2, a black matrix BM, first conductive wiring 21, second conductive wiring 22, a first antenna unit 110, a power receiving unit 15, a power supply control unit 16, a touch driving control unit 17, a touch driving switching circuit 18, a touch detection switching circuit 19, a touch signal transmission and reception control unit 20, and a detection and AD conversion unit 25 are provided on the second surface 42 of the first substrate 1.

The black matrix BM has a rectangular effective display region 71 and a frame region 72 (frame section) surrounding the effective display region 71 (display area). In the example shown in FIG. 2, the black matrix BM is formed on the second surface 42. However, the black matrix BM may be formed on the first surface 41 of the first substrate 1 as the frame region 72.

Further, the black matrix BM may not be necessarily formed on the first substrate 1, and the black matrix BM may be omitted. The frame region 72 may also be a thin frame including a metal as described later. In this case, the black matrix BM may not be necessarily formed in the frame.
(Conductive Wiring)

As shown in FIG. 2, the touch sensing wiring unit 5 is composed of a plurality of pieces of first conductive wiring 21 extending in the X direction (first direction) parallel to each other, and a plurality of pieces of second conductive wiring 22 extending in the Y direction (second direction) parallel to each other. That is, the plurality of pieces of first conductive wiring 21 and the plurality of pieces of second conductive wiring 22 are perpendicular to each other.

Further, in a layer structure of the touch sensing wiring unit 5, the plurality of pieces of second conductive wiring 22 are stacked on the plurality of pieces of first conductive wiring 21 with the insulating layer 38 (fifth insulating layer 38, see FIG. 4) therebetween.

As indicated by the solid line in FIG. 2, part of the first conductive wiring 21 and part of the second conductive wiring 22 are used as lead wires that electrically connect a circuit such as the first antenna unit 110, the touch driving switching circuit 18, and the touch detection switching circuit 19. The power receiving unit 15, the power supply control unit 16, the touch driving control unit 17, the touch driving switching circuit 18, the touch detection switching circuit 19, the touch signal transmission and reception control unit 20, the detection and AD conversion unit 25, and the like shown in FIG. 2 correspond to the "touch function driving unit 4" according to the first embodiment of the present invention.

The circuit for controlling touch sensing (touch function driving unit 4) includes part of the first conductive wiring 21, part of the second conductive wiring 22, and a plurality of third thin film transistors. The power receiving unit 15 smoothes a received voltage and outputs a constant voltage to the power supply control unit 16 as a touch driving voltage. The power supply control unit 16 preferably includes a booster circuit.

Further, part of the second conductive wiring 22 is stacked on the first conductive wiring which constitutes the first antenna unit 110 with a through-hole for electric connection and the insulating layer therebetween, that is, can be applied to the wiring having a two-layer structure.

The first antenna unit 110 includes two sets of antenna pairs (first loop antennas), each having a pair of small-diameter loop antennas whose wiring directions are opposite to each other and whose number of turns is 2 or more. The antenna pair denoted by reference sign 111 is used for transmitting and receiving a signal related to touch sensing in a wireless manner between an antenna pair 115 of the second antenna unit 120, described later, and the antenna pair 111 of the first antenna unit 110.

The antenna pair denoted by reference sign 112 is used for supplying and receiving power required for touch sensing in a wireless manner between the antenna pair 116 of the second antenna unit 120 and the antenna pair 112 of the first antenna unit 110.

In addition, the small-diameter loop antennas may be formed of conductive wiring wound in a spiral shape on the same plane, and can be mounted on a surface of the first substrate.

Figure 3:
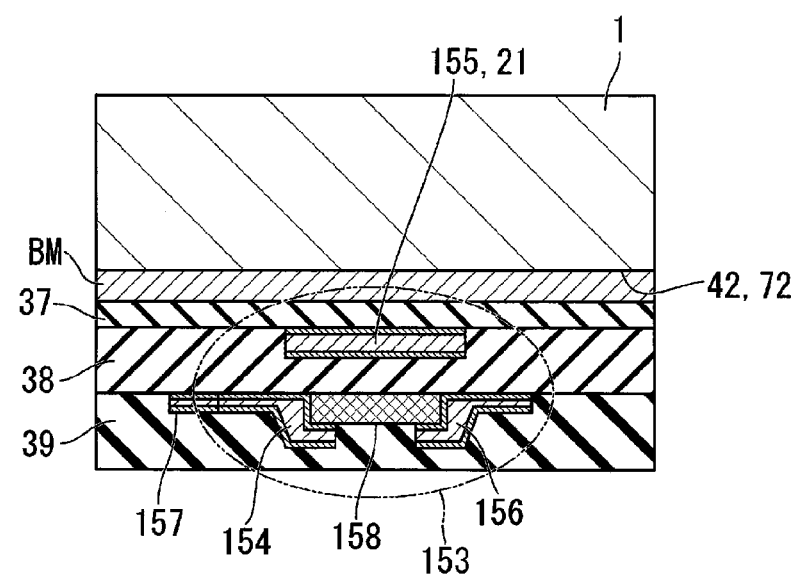
FIG. 3 is a cross-sectional view illustrating a structure of a third thin film transistor formed on a second surface of the first substrate constituting the electronic device according to the first embodiment of the present invention.

FIG. 3 is a cross-sectional view illustrating a structure of a third thin film transistor formed on the second surface 42 of the first substrate 1.

As shown in FIG. 3, a third thin film transistor 153 has a bottom-gate structure, and formed in the frame region 72 of the first substrate 1. The third thin film transistor 153 is formed on the second surface 42 of the first substrate 1 with a fourth insulating layer 37 therebetween. FIG. 3 shows the example having a structure in which the black matrix BM is formed on the second surface 42, and the fourth insulating layer 37 is formed on the black matrix BM. However, the black matrix may not be necessarily formed on the second surface 42.

In the third thin film transistor 153, a gate electrode 155 is formed of conductive wiring having the same configuration as that of the first conductive wiring 21, and formed in the same process as with the first conductive wiring 21. A gate insulating film (fifth insulating layer 38) is stacked on the gate electrode 155, and a channel layer 158, a drain electrode 156, and a source electrode 154 are stacked on the fifth insulating layer 38. The drain electrode 156 and the source electrode 154 are formed of conductive wiring having the same configuration as that of the second conductive wiring 22, and formed in the same process as with the second conductive wiring 22. The source wiring 157 is formed concurrently with the source electrode 154.

The plurality of third thin film transistors 153 and a resistive element formed by patterning a film of a conductive metal oxide layer or an oxide semiconductor forms the touch driving switching circuit 18, the touch detection switching circuit 19, the touch signal transmission and reception control unit 20, the detection and AD conversion unit 25, the power receiving unit 15, the power supply control unit 16, the touch driving control unit 17, all of which are shown in FIG. 2. A capacitor (capacitance element) required for the first antenna unit 110 can be formed when the first conductive wiring 21 and the second conductive wiring 22 are formed. Specifically, a capacitor can be formed by patterning the conductive layer having the same configuration and located in the same layer as that of each of the first conductive wiring 21 and the second conductive wiring 22 into a desired size on each of the upper side and lower side of the fifth insulating layer 38. The channel layer 158 constituting the third thin film transistor 153 is made of an oxide semiconductor.

Figure 4:
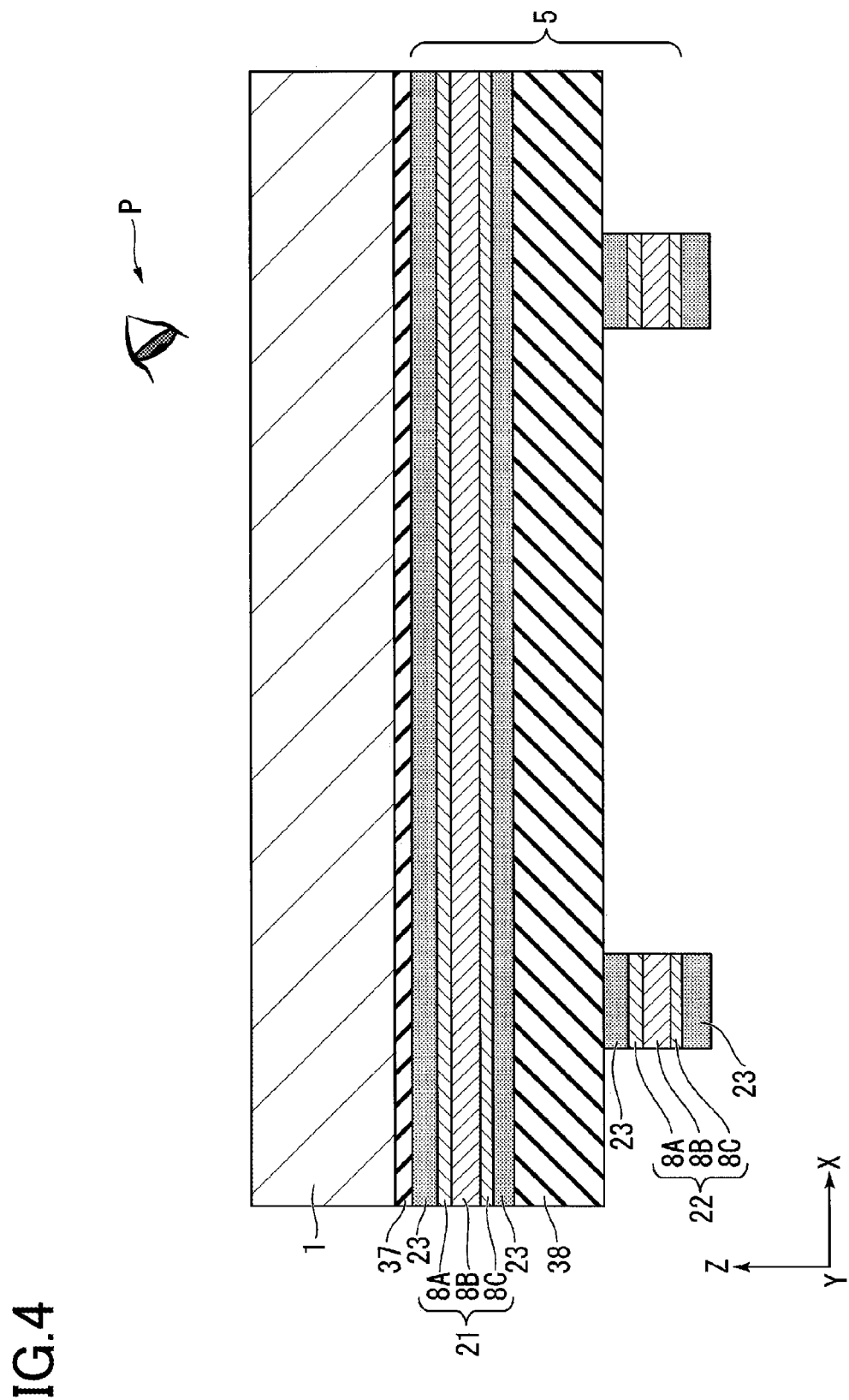
FIG. 4 is a partial cross-sectional view illustrating a touch sensing wiring unit formed on the second surface of the first substrate constituting the electronic device according to the first embodiment of the present invention.

FIG. 4 is a partial cross-sectional view illustrating the touch sensing wiring unit 5 formed on the second surface 42 of the first substrate 1. A structure of the conductive wiring will be described below with reference to FIG. 4.

The first conductive wiring 21 has a configuration in which a copper alloy layer 8B (or a copper layer) is sandwiched between a first conductive metal oxide layer 8A and a second conductive metal oxide layer 8C. The first conductive metal oxide layer 8A and the second conductive metal oxide layer 8C each have a thickness that can be selected from the range of, for example, 10 nm to 100 nm thick. The copper alloy layer 8B has a thickness that can be selected from the range of, for example, 50 nm to 2000 nm. Alternatively, the thickness may be larger than 2000 nm. The conductive metal oxide layers 8A, 8C and the copper alloy layer 8B can be formed by sputtering or other vacuum film formation methods. When a plating method is used in combination to form the copper alloy layer 8B, the thickness can be larger than that described above. The second conductive wiring 22 has the same structure as the first conductive wiring 21.

As shown in FIG. 4, the first conductive wiring 21 is sandwiched by the first light absorbing layers 23 (light absorbing layers). Specifically, in the structure of the conductive wiring (first conductive wiring 21, second conductive wiring 22), a structure can be adopted in which a copper layer or a copper alloy layer is covered with a conductive metal oxide layer, and the conductive metal oxide layer is covered with a light absorbing layer. That is, the light absorbing layer is provided on the front and rear surfaces of the conductive wiring.

By covering the surfaces (front and rear sides) of the conductive wiring with the light absorbing layer, the display clarity can be improved. A conductive metal oxide layer and a light absorbing oxide layer can be further provided on the rear surface of the copper layer or the copper alloy layer as viewed in the observation direction. As the conductive metal oxide layer formed on the rear surface of the copper layer or the copper alloy layer, a high melting point metal or a copper alloy layer may be replaced with a copper alloy layer having a different composition.

In general, copper and copper alloy have poor adhesion to a light absorbing layer such as a glass substrate or a black matrix. In the configuration of the first embodiment of the present invention, the conductive metal oxide layer is disposed at the interface between the copper layer or the copper alloy layer and the light absorbing layer. In this configuration, the conductive metal oxide layer serves as an adhesive layer to provide practical reliability. Further, an oxide of copper is formed on an exposed surface of the copper layer or the copper alloy layer over time, which causes a problem in electrical mounting. Covering the surface of the copper or the copper alloy with the conductive metal oxide layer can prevent oxidation of the copper layer or the copper alloy layer. Forming the conductive oxide enables formation of an ohmic contact, which is advantageous in electrical mounting.

(Copper Alloy Layer)

The copper alloy layer 8 will now be specifically described.

The copper alloy layer 8B includes, for example, a first element that forms a solid solution with copper, and a second element having electronegativity smaller than that of each of copper and the first element. The first and second elements increase the specific resistance of the copper alloy layer by 1 µΩcm/at % or less when added to copper. The copper alloy layer has a specific resistance in the range of 1.9 µΩcm to 6 µΩcm. The element that forms a solid solution with copper in the present embodiment can be rephrased as an element that substitutionally forms a solid solution with copper in the temperature range from −40° C. to +80° C., which is a temperature range for electronic devices including vehicle-mounted electronic devices. The element(s) can be added to copper unless the electrical resistance (synonymous with specific resistance) of the copper alloy exceeds 6 µΩcm. If a base matrix material is copper, examples of a metal having a wide solid solution range with copper include gold (Au), nickel (Ni), zinc (Zn), gallium (Ga), palladium (Pd), and manganese (Mn). Aluminum (Al) forms solid solutions with copper, though the solubility range is not wide.

Examples of an element having low electrical resistance (copper alloy element) include palladium (Pd), magnesium (Mg), beryllium (Be), gold (Au), calcium (Ca), cadmium (Cd), zinc (Zn), and silver (Ag). Adding these elements to pure copper at 1 at % increases electrical resistance by approximately 1 µΩcm or less. Calcium (Ca), cadmium (Cd), zinc (Zn) and silver (Ag) are preferable alloying elements because they increase electrical resistance of the copper alloy layer by 0.3 µΩcm/at % or less. Zinc and calcium are particularly preferable in terms of economy and environmental friendliness. Zinc and calcium can each be added to copper at up to 5 at %.

The amount of zinc and calcium to be added may be adjusted within the range of the additive amount described above. For example, the additive amount of calcium can be increased or the additive amount of zinc can be decreased. Adding at least 0.2 at % of zinc and calcium to copper respectively creates a prominent effect.

Adding 0.4 at % of zinc and calcium in total to pure copper produces a copper alloy having an electrical resistivity of approximately 1.9 µΩcm. Hence the lower limit of electrical resistivity of the copper alloy layer 8B according to the first embodiment of the present invention is 1.9 µΩcm. Adding over 5 at % of calcium (Ca), cadmium (Cd), zinc (Zn) and silver (Ag) to copper prominently increases the electrical resistance of the copper alloy. It is therefore preferable to add these elements at 5 at % or less.

Electronegativity refers to a relative measure of strength at which atoms (elements) attract electrons. The smaller electronegativity value an element has, the more likely it is to form a cation. The electronegativity of copper is 1.9. The electronegativity of oxygen is 3.5. Examples of elements having low electronegativity include alkaline earth elements, titanium group elements, and chromium group elements. An alkali element also has low electronegativity, but presence of an alkali element or water near the copper accelerates copper diffusion. For this reason, alkali elements such as sodium and potassium cannot be used as a copper alloy element.

The electronegativity of calcium is only 1.0. When calcium is used as a copper alloy element, calcium is oxidized preferentially compared to copper during heat treatment or the like to produce calcium oxide. Accordingly, copper diffusion can be reduced. In the conductive wiring according to the first embodiment of the present invention, calcium oxide can be selectively formed on an exposed surface of a copper alloy layer that is not covered with a conductive metal oxide layer or at the interface between a copper alloy layer and a conductive metal oxide layer. In particular, forming calcium oxide on the exposed surface of the copper alloy layer that is not covered with a conductive metal oxide layer contributes to lower copper diffusion and improved reliability. Annealing and other heat treatments improve the conductivity of the conductive wiring and copper alloy layer according to the first embodiment of the present invention. The electronegativities mentioned above are indicated by Pauling electronegativity values. In the conductive wiring according to the first embodiment of the present invention, the second element is preferably oxidized preferentially compared to copper and the first element to form an oxide by heat treatment or other process on the conductive wiring. In addition, it is preferable to prevent the copper or copper alloy from being contaminated with hydrogen or oxygen.

The first embodiment of the present invention employs a configuration in which the copper alloy layer 8B is sandwiched between the first conductive metal oxide layer 8A and the second conductive metal oxide layer 8C. In this configuration, heat treatment (annealing) often improves electrical resistance. In other words, in the first embodiment of the present invention, covering the copper alloy layer 8B with a conductive metal oxide prevents the surface of the copper alloy layer 8B from oxidizing. In addition, the conductive metal oxide layer formed on the front and rear surfaces of the copper alloy layer 8B restricts (anchors) the copper alloy layer, which prevents the grains of the copper alloy layer 8B from becoming excessively coarse, so that the surface of the copper alloy layer 8B will not become coarse. Even if an alloy element is added to the copper alloy layer 8B at low density (e.g., approximately 0.2 at %), crystal grains are unlikely to become large, so that carrier scattering (deterioration of electrical resistance) is unlikely to occur at the coarse grain boundaries.

In the conductive wiring according to the first embodiment of the present invention, in which copper alloy containing calcium is used as the copper alloy layer 8B, calcium oxide may be sometimes formed at the interface between the copper alloy layer 8B and the first conductive metal oxide layer 8A and at the interface between the copper alloy layer 8B and the second conductive metal oxide layer 8C, or on a side surface of the copper alloy layer 8B. Calcium oxide is often formed by low-temperature annealing and heat treatment, which will be described later. The calcium oxide formed on the surface of the copper alloy layer 8B or at the interface between the copper alloy layer and the conductive metal oxide layer prevents copper diffusion and contributes to better reliability.

As described above, the conductive wiring according to the first embodiment of the present invention can be applied to the first conductive wiring and the second conductive wiring of the first substrate 1. Further, conductive wiring having the same configuration as that of the above conductive wiring can be applied to a source wiring 66, power supply lines 50, 51, gate wiring 69, and a second substrate 2. In addition, conductive wiring having the same configuration as that of the above conductive wiring can also be applied to wiring formed on the third substrate 3, for example, wiring as a base layer before a module such as an NFC communication unit 126 is formed, and wiring of the antenna unit. Since low resistance is required for the wiring of the antenna unit, the copper layer (or the copper alloy layer) included in the configuration of the conductive wiring desirably have an increased film thickness.

(Conductive Metal Oxide Layer)

Now a description will be given of a structure of the first conductive metal oxide layer 8A and the second conductive metal oxide layer 8C, which are described above, and of a third conductive metal oxide layer and a fourth conductive metal oxide layer, which will be described later. Hereinafter, the first to fourth conductive metal oxide layers are simply referred to as conductive metal oxide layers.

The conductive metal oxide layers may be made of, for example, complex oxides containing two or more metal oxides selected from the group consisting of an indium oxide, a zinc oxide, an antimony oxide, gallium oxide, and a tin oxide. For example, antimony oxide can be added to the conductive metal oxide layers described above since antimony oxide does not easily form a solid solution region with copper and prevents copper from diffusing in a layer configuration. A small amount of titanium, zirconium, magnesium, aluminum, germanium or other elements can also be added to the conductive metal oxide layers.

Copper layers or copper alloy layers are poorly adhesive to a transparent resin and a glass substrate (i.e. when applied to the first substrate, the second substrate and the third substrate). If the copper layer or the copper alloy layer is directly applied to the display device substrate formed of a transparent resin and a glass substrate, it will be hard to produce a practical display device substrate. On the other hand the above-mentioned complex oxide (conductive metal oxide) is sufficiently adhesive to a light absorbing resin layer, a black matrix, a transparent resin, a glass substrate and the like, and also sufficiently adhesive to a copper layer and a copper alloy layer. Accordingly, a practical display device substrate can be produced by applying a copper layer or copper alloy layer that contains a complex oxide to the display device substrate.

In addition, there is a concern that non-conductive copper oxide may be formed on the surface of the copper layer or the copper alloy layer over time, resulting in poor electrical contact. On the other hand, a complex oxide layer made such as of indium oxide, zinc oxide, antimony oxide, gallium oxide, or tin oxide can achieve stable ohmic contact and facilitate electrical implementation through conductive transfer or a contact hole.

The above structures of the conductive wiring can be applied not only to the conductive wiring 21 and 22 formed on the first substrate 1, but also to the conductive wiring formed on the second substrate 2 and the third substrate 3, and the wiring that forms the antenna unit, the electrodes that form the thin film transistor, the wiring connected to the electrodes, and the like.

(Second Substrate)

Figure 5:
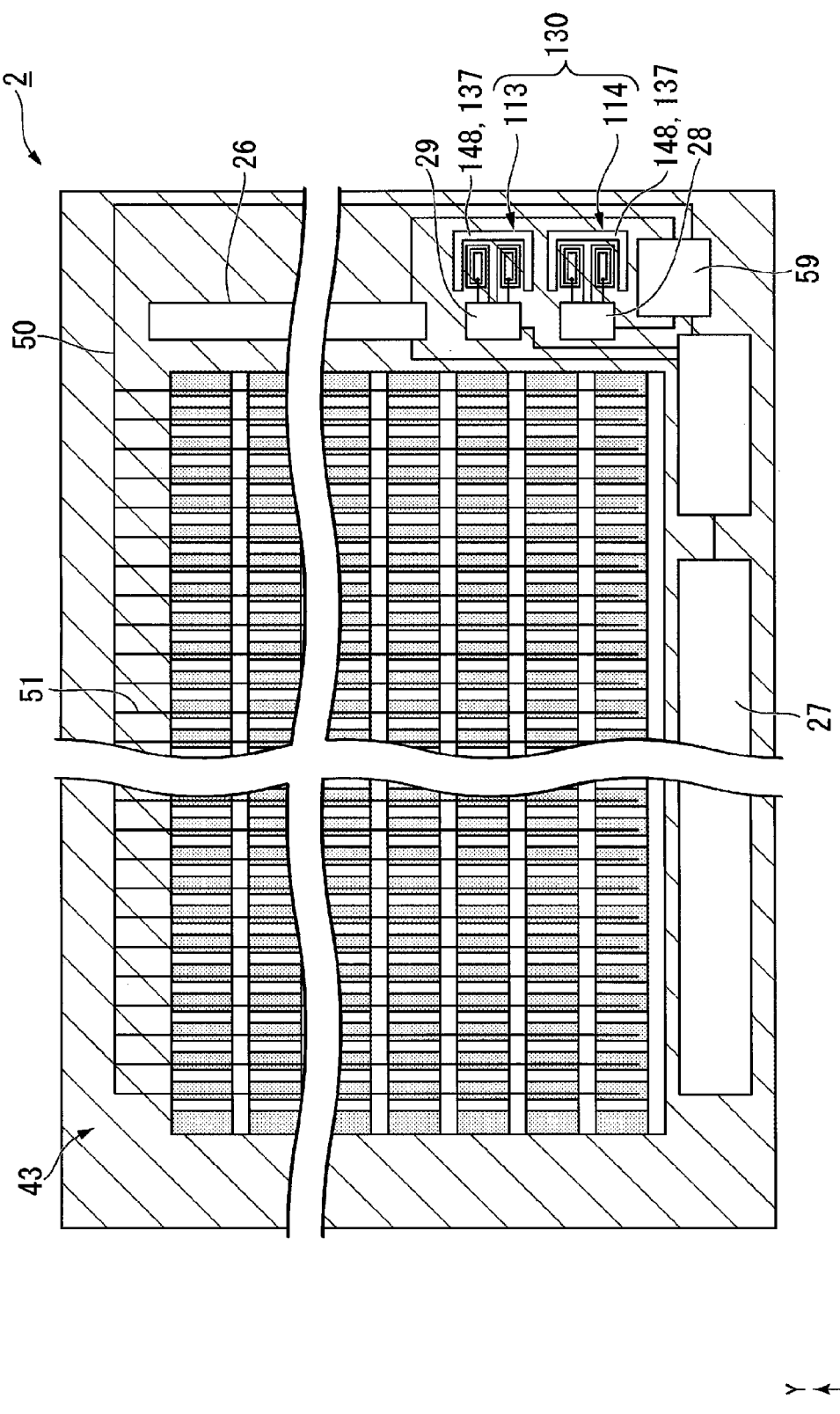
FIG. 5 is a plan view of the second substrate included in the electronic device according to the first embodiment of the present invention as viewed in an observation direction.

FIG. 5 is a plan view illustrating the second substrate 2 constituting the electronic device E1.

As shown in FIG. 5, the display unit 40 provided on the third surface 43 of the second substrate 2 includes a thin film transistor array (not shown), a light emitting element CHIP (LED chip, light emitting diode element), a third antenna unit 130, and the like. Specifically, the third antenna unit 130, a source signal switching circuit 26, a gate signal switching circuit 27, a second power receiving unit 28, a video signal receiving unit 29, a second power supply control unit 59, and the like are provided on the third surface 43. The second power supply control unit 59 preferably includes a booster circuit.

The source signal switching circuit 26, the gate signal switching circuit 27, the second power receiving unit 28, the video signal receiving unit 29, the second power supply control unit 59, and the like shown in FIG. 5 correspond to the display function driving unit 7 according to the first embodiment of the present invention.

In the second substrate 2, a first thin film transistor 67 (described later) and a second thin film transistor 68 (described later) for driving the display functional layer 6 are provided at a position corresponding to a pixel opening PX. In FIG. 5, the first thin film transistor 67 and the second thin film transistor 68 are not shown.

The third antenna unit 130 includes two sets of antenna pairs (third loop antennas), each having a pair of small-diameter loop antennas whose wiring directions are opposite to each other and whose number of turns is 2 or more. The antenna pair denoted by reference sign 113 is used for transmitting and receiving a signal related to driving of the display functional layer in a wireless manner between an antenna pair 117 of the fourth antenna unit 140, described later, and the antenna pair 113.

The antenna pair denoted by reference sign 114 is used for supplying and receiving power required for driving of the display functional layer in a wireless manner between an antenna pair 118 of the fourth antenna unit 140 and the antenna pair 114.

The number of turns of the small-diameter loop antenna may be selected from the range of, for example, 2 to 25.

Figure 6:
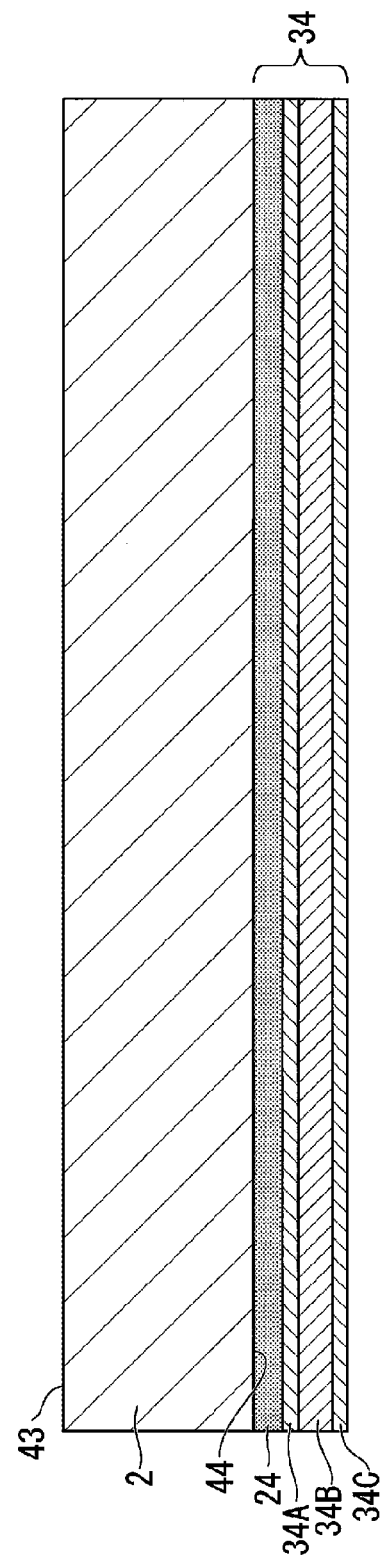
FIG. 6 is a partial cross-sectional view illustrating a conductive shield layer formed on a fourth surface of the second substrate constituting the electronic device according to the first embodiment of the present invention.

FIG. 6 is a cross-sectional view of a conductive shield layer 34 provided on a fourth surface 44 of the second substrate 2. In FIG. 6, the conductive shield layer 34 has a configuration in which a second light absorbing layer 24 (light absorbing layer), a first conductive metal oxide layer 34A, a copper alloy layer 34B, and a second conductive metal oxide layer 34C are stacked in this order on the fourth surface 44. As shown in FIG. 6, by adopting the conductive layer (copper alloy layer 34B) having a low resistance as part of the conductive shield layer 34, the influence of noise generated from the system control unit 30 and the loop antenna 128 on the touch sensing functional layer (first antenna unit 110, touch function driving unit 4) and the display functional layer 6 can be reduced.

The conductive layer of the conductive shield layer 34 may be a conductive film having a sheet resistance of 100Ω/☐ (Ω/sq) or less. The structure of the conductive metal oxide layer may be a multilayer structure or a single layer structure. A single layer of a metal layer or an alloy layer of molybdenum, aluminum, copper, silver, nickel, or the like, or a multilayer thereof can be used. A metal layer or an alloy layer, having high thermal conductivity, added to the conductive shield layer, can contribute to dissipation of heat attributed to light emission of the light emitting element.

Since the second light absorbing layer 24 is disposed between the copper alloy layer 34B and the second substrate 2, a configuration that does not include a circularly polarizing plate such as that described in PTL 6 can be achieved. The circularly polarizing plate is used for the purpose of absorbing external light reflection on the pixel electrode (reflection electrode) to thereby produce "black." The circularly polarizing plate is an optical film with a relatively large thickness in the range of 0.1 mm to 0.3 mm. If such a thickness of the circularly polarizing plate together with a thickness of the cover glass is added, the thickness of the electronic device will be increased by approximately 1 mm. Since the second light absorbing layer 24 is inserted without using the circularly polarizing plate, the light emitting diode element can appear "black" when turned off. In addition, the thicknesses of the first substrate 1 and the third substrate 3 can be increased to enhance the strength required for the electronic device, and the thickness of the second substrate 2 can be reduced and the cover glass can be omitted to provide the light and thin electronic device.

(Third Substrate)

Figure 7:
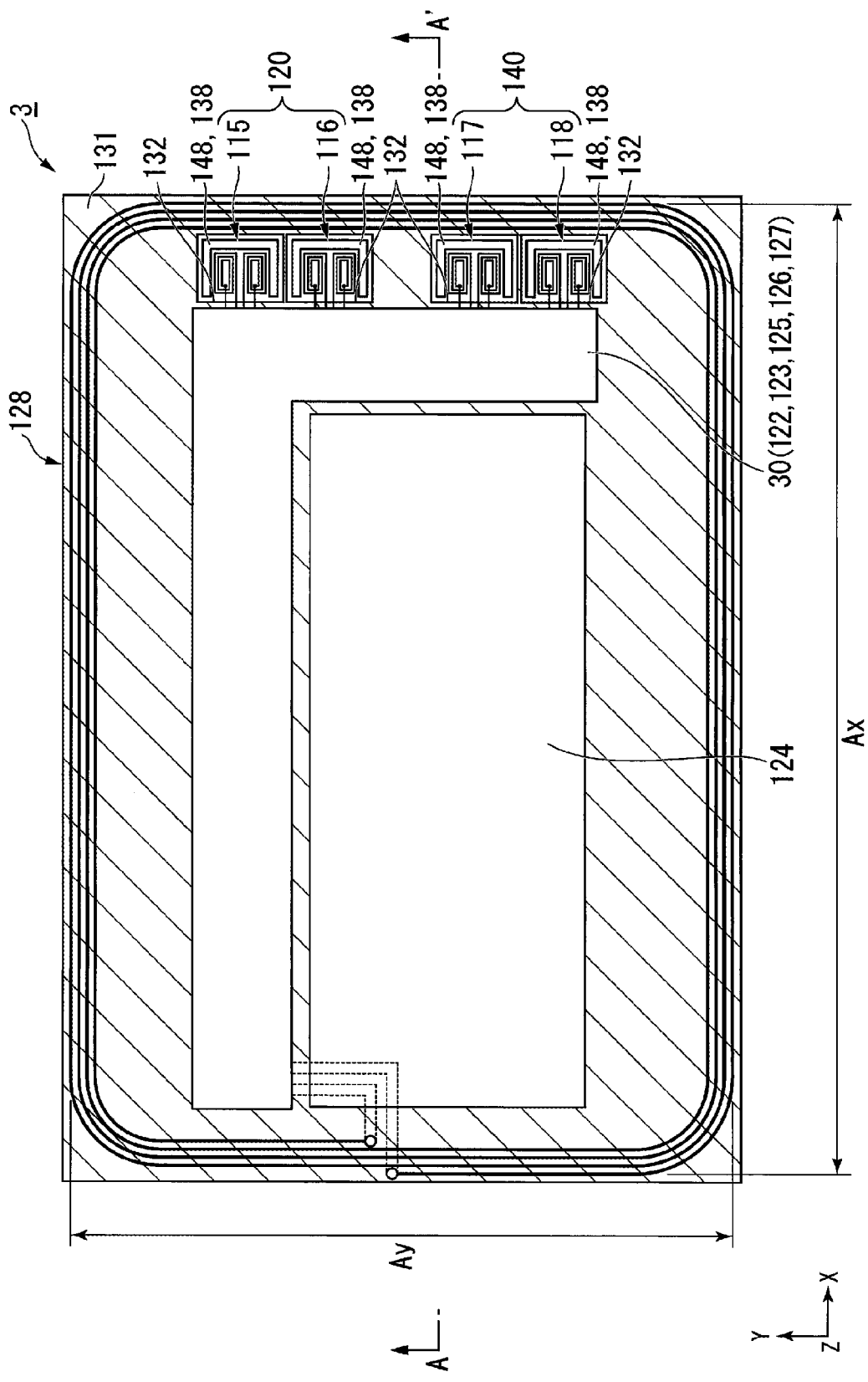
FIG. 7 is a plan view of the third substrate included in the electronic device according to the first embodiment of the present invention as viewed in an observation direction.

FIG. 7 is a plan view illustrating the third substrate 3 constituting the electronic device E1.

Figure 8:
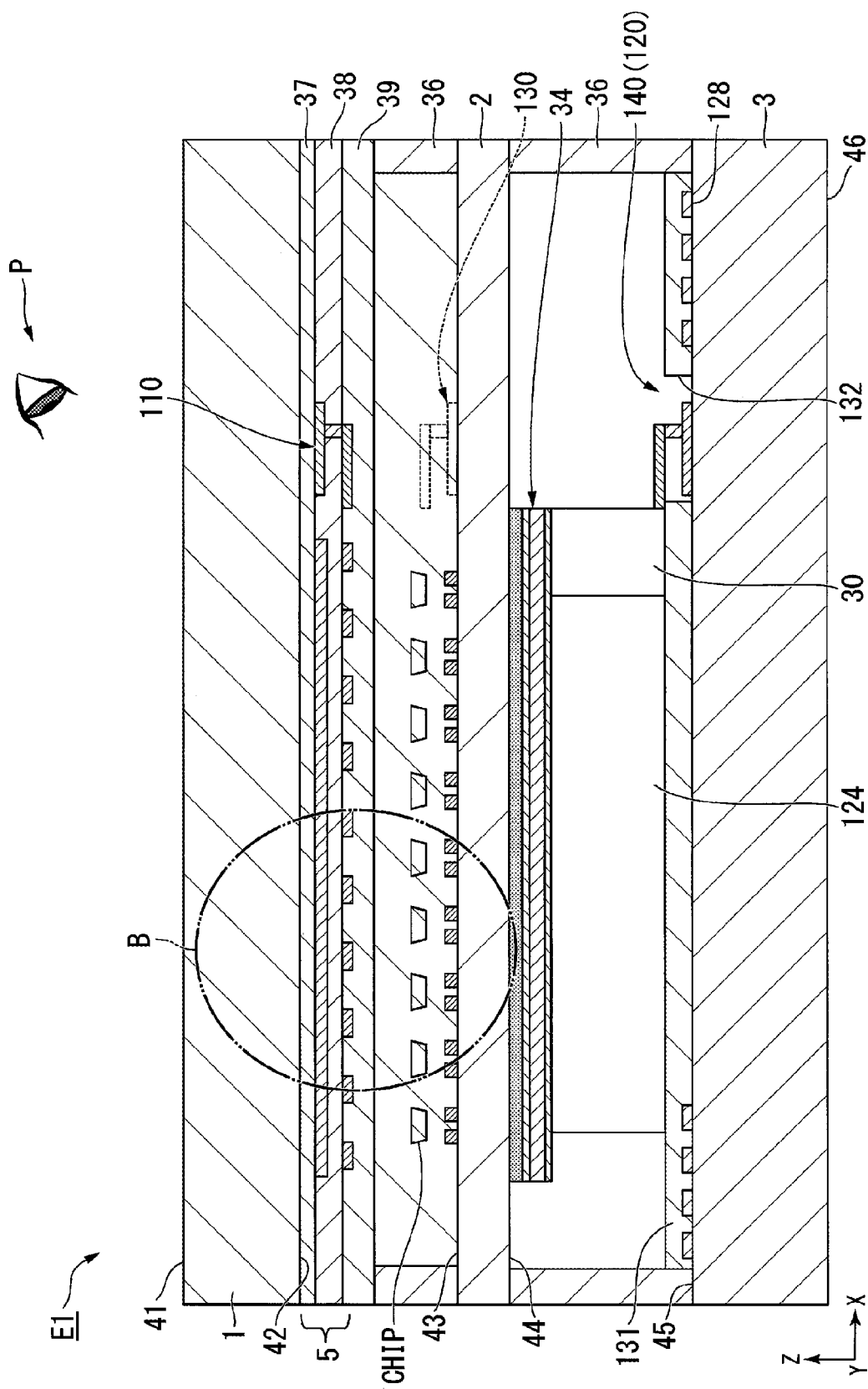
FIG. 8 is a view partially illustrating the electronic device according to the first embodiment of the present invention, showing a cross-sectional view taken along the line A-A' of FIG. 7.

The third substrate 3 has a fifth surface 45, and a sixth surface 46 located on the side opposite to the fifth surface 45 (see FIG. 8).

As shown in FIG. 7, the loop antenna 128, the second antenna unit 120, the fourth antenna unit 140, a magnetic layer 131, the secondary battery 124, the system control unit 30, and the like are provided on the fifth surface 45 of the third substrate 3. Further, these members formed on the third substrate 3 are provided between the fourth surface 44 of the second substrate 2 and the fifth surface 45 of the third substrate 3 as shown in FIG. 1.

The system control unit 30 includes the CPU 122, the charge control unit 123, the switching unit 125, the NFC communication unit 126, the antenna unit 127, the second antenna unit 120, the fourth antenna unit 140, and the secondary battery 124. The CPU 122 controls a touch sensing function in the touch sensing unit 10, a display function in the display unit 40, a communication function, and a wireless charging function.

The second antenna unit 120 includes two sets of antenna pairs (second loop antennas), each having a pair of small-diameter loop antennas whose wiring directions are opposite to each other and whose number of turns is 2 or more, which are specifically antenna pairs 115 and 116.

The fourth antenna unit 140 includes two sets of antenna pairs (fourth loop antennas), each having a pair of small-diameter loop antennas whose wiring directions are opposite to each other and whose number of turns is 2 or more, which are specifically antenna pairs 117 and 118.

In plan view of the electronic device E1, in which the first substrate 1, the second substrate 2, and the third substrate 3 mutually overlap, the second antenna unit 120 is superposed on the first antenna unit 110, and the fourth antenna unit 140 is superposed on the third antenna unit 130.

The antenna pair 115 of the second antenna unit 120 and the antenna pair 111 of the first antenna unit 110 are wound in the same direction and superposed on each other. The antenna pair 116 of the second antenna unit 120 and the antenna pair 112 of the first antenna unit 110 are wound in the same direction and superposed on each other. The antenna pair 117 of the fourth antenna unit 140 and the antenna pair 113 of the third antenna unit 130 are wound in the same direction and superposed on each other. The antenna pair 118 of the fourth antenna unit 140 and the antenna pair 114 of the third antenna unit 130 are wound in the same direction and superposed on each other. The superposed relationship between the first antenna unit 110 and the second antenna unit 120, and the superposed relationship between the third antenna unit 130 and the fourth antenna unit 140 will be described later.

Preferably, the loop antenna 128 is formed of conductive wiring wound in a spiral shape on the same plane, can be mounted on a surface of the third substrate, and, for example, has a loop antenna shape that can be housed in a rectangular frame region 72 shown in FIG. 7. The loop antenna 128 is disposed at a position corresponding to the frame region 72 that surrounds the effective display region 71. Therefore, the outer shape of the loop antenna 128 has a size slightly larger than the size of the effective display region 71 in the display unit 40.

Further, the first antenna unit 110, the second antenna unit 120, the third antenna unit 130, and the fourth antenna unit 140 each have a size smaller than that of the loop antenna 128. The first antenna unit 110, the second antenna unit 120, the third antenna unit 130, and the fourth antenna unit 140 are disposed at positions that are not superposed on the loop antenna 128 when viewed in the observation direction.

The number of turns of the loop antenna 128 may be in the range of, for example, 2 to 10. In the present embodiment, the number of turns of the loop antenna shown in FIG. 7 is 5. However, the number of turns of the antenna can be selected from the range of, for example, 1 to 25. The number of turns can be selected based on the selected resonance frequency and setting conditions of the impedance of the antenna optimum for resonance. The loop antenna 128 preferably has a large loop area (Ax×Ay).

The capacitance of the capacitive element, which is omitted in FIG. 7, is adjusted for resonance. Specifically, during wireless charging, the resonance is adjusted by the charge control unit 123. For NFC communication, the resonance is adjusted by the NFC communication unit 126. The wireless charging and the NFC communication are switched by the switching unit 125.

Examples of the secondary battery 124 include a lithium battery, a nickel hydrogen battery, an organic radical battery, a lead battery, a lithium air battery, a nickel zinc battery, a nickel cadmium battery, and a silver zinc battery. For example, a laminated lithium battery in which nylon, a metal layer such as aluminum, cycloparaphenylene (CPP), electrode, separator, electrolytic solution, and the like are laminated in a packaging material may be used. Preferably, a secondary battery such as an all-solid-state lithium battery, for example, a lithium sulfur battery is applied to the secondary battery 124. Further, the second surface of the first substrate and the third surface of the second substrate, which have insufficient space thereon to provide the secondary battery 124 in terms of space (thickness between the substrates), can be provided with, for example, a large-capacity capacitor. In the configuration of the large-capacity capacitor, a thin film formed by a method such as vacuum deposition can be used.

Electronic devices such as an LTE communication module, a WiFi communication module, and a GPS receiving module may be further provided between the fourth surface 44 of the second substrate 2 and the fifth surface 45 of the third substrate 3 to be mounted on the fourth surface 44 or the fifth surface 45.

FIG. 8 is a cross-sectional view of the electronic device E1 taken along the line A-A' of FIG. 7. The first substrate, the second substrate, and the third substrate are arranged in this order when viewed by the observer P. In FIG. 8, the black matrix BM is omitted.

As shown in FIG. 8, the loop antenna 128, the second antenna unit 120, and the fourth antenna unit 140 are provided on the fifth surface 45 of the third substrate 3. Further, the magnetic layer 131 is provided on the fifth surface 45 so as to cover the loop antenna 128. The magnetic layer 131 has an opening 132 such that the second antenna unit 120 and the fourth antenna unit 140 are provided inside the opening 132. In other words, the second antenna unit 120 and the fourth antenna unit 140 are not covered with the magnetic layer 131.

The system control unit 30 and the secondary battery 124 are disposed on the magnetic layer 131. The system control unit 30 is electrically connected to the loop antenna 128, the second antenna unit 120, and the fourth antenna unit 140 via a through hole formed in the magnetic layer 131. The conductive shield layer 34 is provided on the upper surface of the secondary battery 124 and the system control unit 30, in other words, the conductive shield layer 34 is provided between the upper surfaces of the secondary battery 124 and the system control unit 30 and the fourth surface 44 of the second substrate 2.

The touch sensing unit 10 including the touch sensing wiring unit 5 is provided on the second surface 42 of the first substrate 1. Between the first conductive wiring 21 and the second conductive wiring 22, which constitute the touch sensing wiring unit 5, in the thickness direction (Z direction) of the first substrate 1, the fifth insulating layer 38 is disposed. Further, in formation of the touch sensing wiring unit 5, the fourth insulating layer 37 may be formed on the second substrate before forming the conductive wiring (first conductive wiring 21). Preferably, a sixth insulating layer 39 is formed on the second conductive wiring 22.

Figure 9:
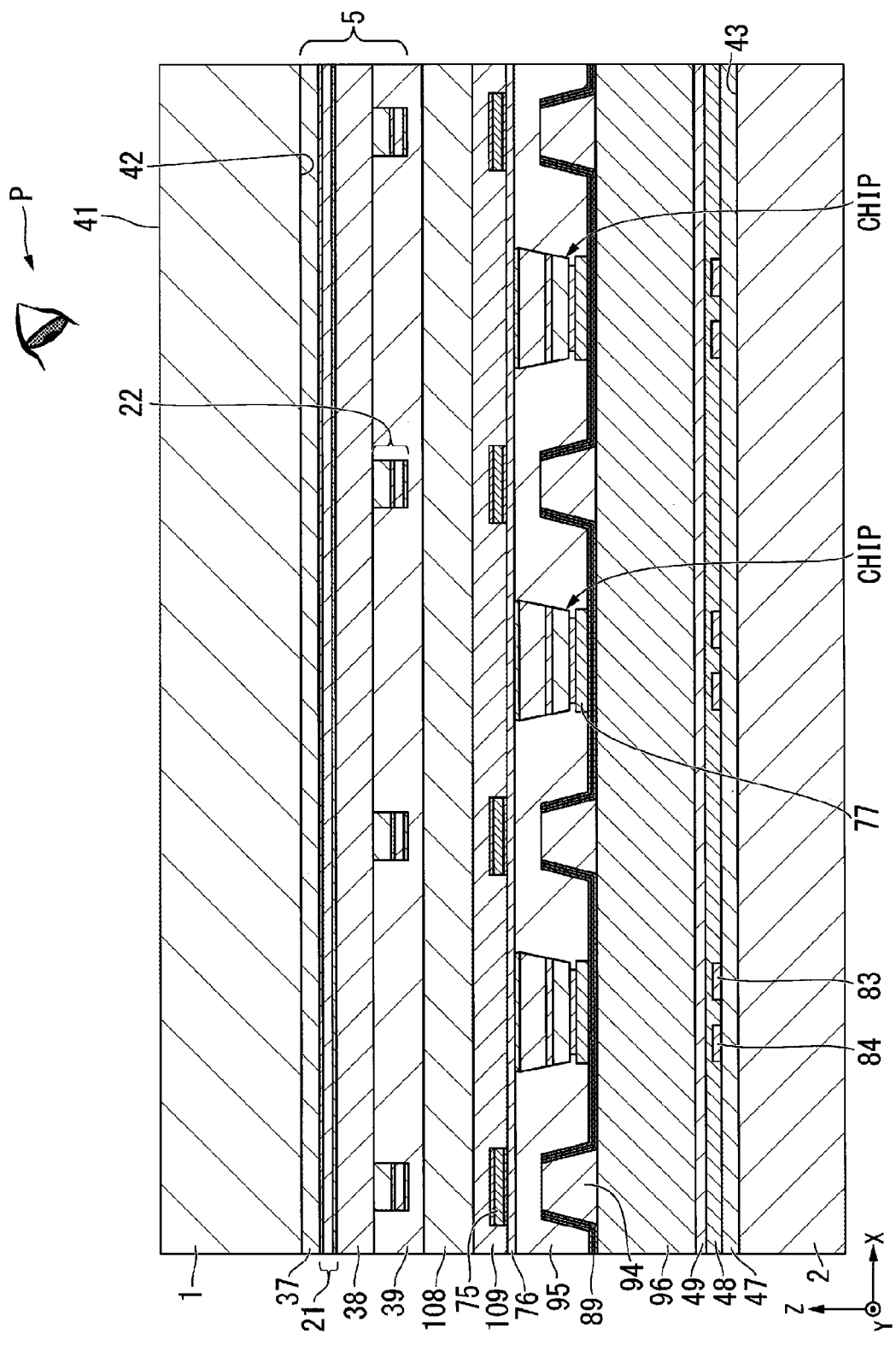
FIG. 9 is a cross-sectional view partially illustrating the electronic device according to the first embodiment of the present invention, showing an enlarged view of a region indicated by reference sign B of FIG. 8.
Figure 10:
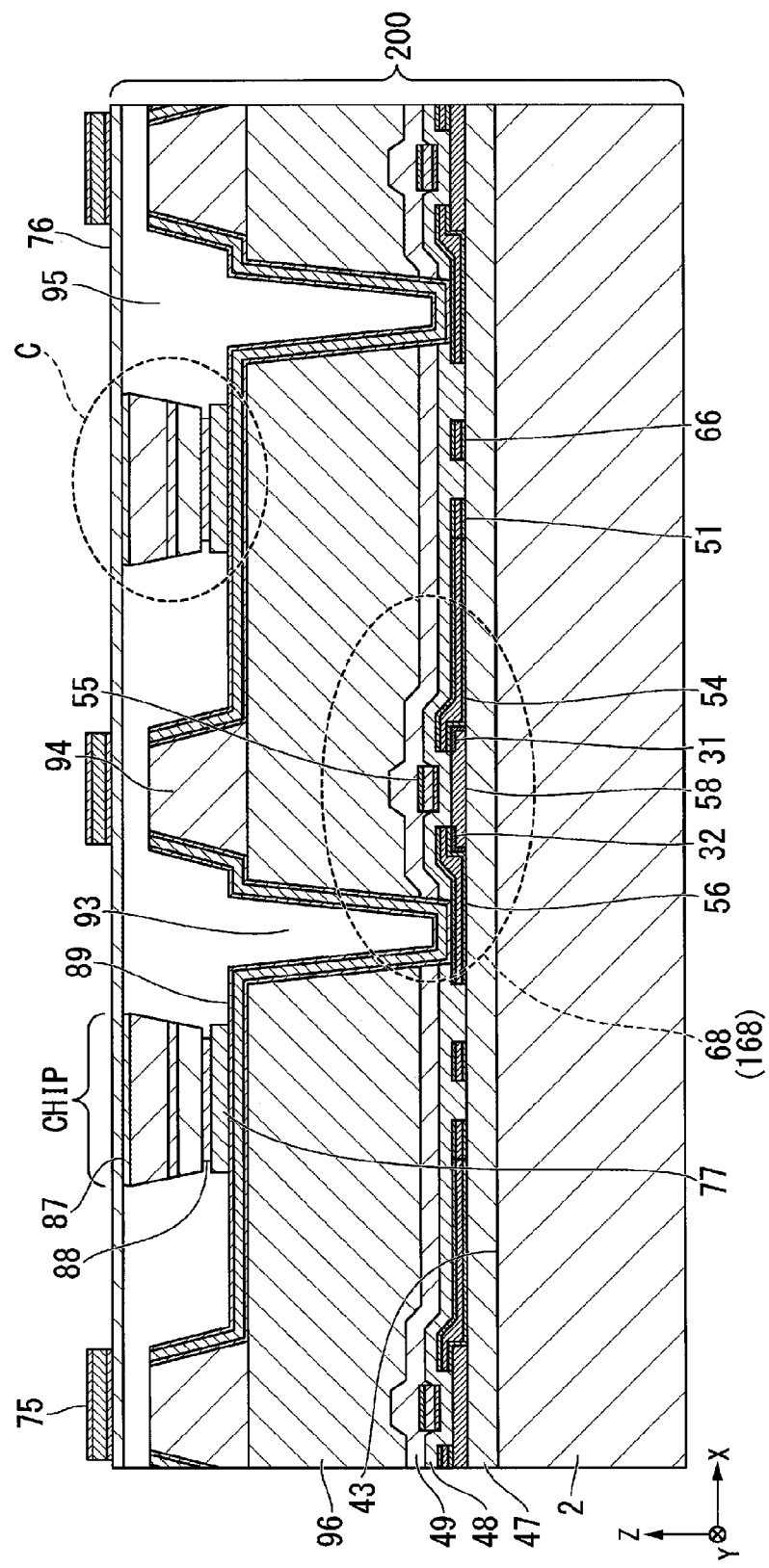
FIG. 10 is an enlarged view partially illustrating the second substrate included in the electronic device according to the first embodiment of the present invention, showing a partial cross-sectional view of a second thin film transistor.
Figure 11:
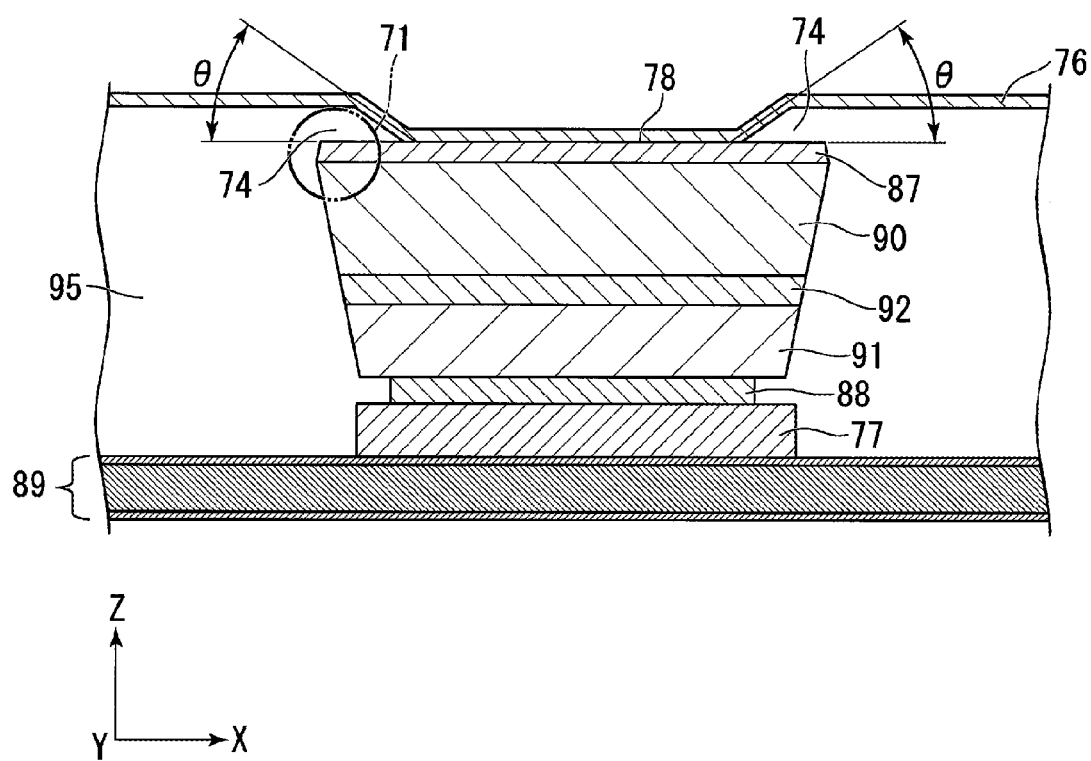
FIG. 11 is a cross-sectional view illustrating a light emitting diode element (LED) mounted on the electronic device according to the first embodiment of the present invention, showing an enlarged view of a region indicated by reference sign C of FIG. 10.

With reference to FIGS. 9 to 11, a peripheral structure of the light emitting element CHIP (LED chip, light emitting diode element) will be described.

FIG. 9 is a cross-sectional view partially illustrating the electronic device E1, showing an enlarged view of a region indicated by reference sign B of FIG. 8. In FIG. 9, the black matrix BM is omitted.

FIG. 10 is an enlarged view partially illustrating the second substrate 2 included in the electronic device E1, mainly showing a cross-sectional view of the light emitting element CHIP and the second thin film transistor 68 (thin film transistor 168) provided on the second substrate 2.

FIG. 11 is a cross-sectional view illustrating a light emitting element CHIP mounted on the electronic device E1, showing an enlarged view of a region indicated by reference sign C of FIG. 10.

(Light Emitting Element)

A lower electrode 88 constituting the light emitting element CHIP is electrically linked to a reflective electrode 89 via a bonding layer 77. The reflective electrode 89 is connected to the second thin film transistor 68 that serves as a driving transistor for driving the light emitting element CHIP via a contact hole 93.

The light emitting element CHIP receives power supplied from the first power supply line 51 via the second thin film transistor 68.

The front layer (front surface layer) of the upper electrode 87 is formed of a conductive metal oxide. An auxiliary conductor 75 and a transparent conductive film 76 are conductive layers having a structure in which copper or copper alloy is sandwiched between conductive metal oxides, and formed in the same layer and by the same process. In FIG. 10, the auxiliary conductor 75 extends, for example, in the direction perpendicular to the drawing plane, that is, in the Y direction. The auxiliary conductor 75 communicates with the second power supply line 52 (see FIG. 18) extending in the X direction. The arrangement of the first power supply line 51 and the second power supply line 52 in plan view will be described later with reference to FIG. 18.

For example, a conductive material that can fuse the lower electrode 88 of the light emitting element CHIP and the reflective electrode 89 in the temperature range of 150° C. to 340° C. to establish electrical connection therebetween can be applied to the bonding layer 77. In the conductive material, a conductive filler such as silver, carbon, or graphite may be dispersed in a thermally Plowable resin. Alternatively, the bonding layer 77 can be formed by using In (indium), InBi alloy, InSb alloy, InSn alloy, InAg alloy, InGa alloy, SnBi alloy, SnSb alloy, or the like, or a low melting point metal, which is a ternary compound system or a quaternary compound system of these metals.

The surface of the reflective electrode 89 can be made of a complex oxide including indium oxide (conductive metal oxide), a silver alloy, or the like. The surface of the reflective electrode 89 made of a complex oxide including indium oxide or a silver alloy facilitates electrical connection between the bonding layer 77 and the reflective electrode 89 described above. Further, by decreasing the area of the reflective electrode 89 relative to the opening, the "black" color produced by the second light absorbing layer 24 can be utilized.

Since these low melting point metals have good wettability with the above conductive metal oxides, the lower electrode 88 and the reflective electrode 89 can be fused in a self-aligned manner after the lower electrode 88 and the reflective electrode 89 are roughly aligned with each other. Various energies such as heat, pressure, electromagnetic waves, laser light, and a combination of these and ultrasonic waves can be used to provide the energy required for the fusion. Further, vertical light emitting diodes are advantageous in ease of repair when bonding failure occurs. Horizontal light emitting diodes, in which electrodes are arranged in the same direction, have disadvantages that bonding inspection of the individual diodes is difficult to perform and that the electrodes are likely to be short-circuited during repairs (for example, replacement of a defective diode). In this regard, vertical light emitting diodes are preferably used. The bonding layer 77 can be patterned by known photolithography or a lift-off process after film formation such as vacuum deposition.

In the present embodiment, the light emitting element CHIP is a vertical light emitting diode that serves as the display functional layer, which is provided for each of a plurality of pixels PX.

The light emitting element CHIP has a structure in which the upper electrode 87, an n-type semiconductor layer 90, a light emitting layer 92, a p-type semiconductor layer 91, and a lower electrode 88 are arranged in this order. In other words, the light emitting element CHIP has a configuration in which the p-type semiconductor layer 91, the light emitting layer 92, the n-type semiconductor layer 90, and the upper electrode 87 are stacked in this order on the lower electrode 88. As shown in FIG. 11, the electrodes used for LED light emission are formed on different surfaces, and are formed on the surfaces facing each other. Further, the upper electrode 87 and the lower electrode 88 are stacked on the outer surfaces of the n-type semiconductor layer 90 and the p-type semiconductor layer 91, respectively, which are arranged parallel to each other. The light emitting element CHIP having such a structure is referred to as a vertical light emitting diode in the present embodiment. An LED structure having an irregular shape such as a pyramid shape in cross-sectional view is not included as an example in the vertical light emitting diode in the embodiment of the present invention. A structure in which electrodes are arranged on one side of the LED structure, or a structure in which electrodes are arranged in the horizontal direction is referred to as a horizontal light emitting diode.

As shown in FIG. 11, on the light emitting element CHIP, the transparent conductive film 76 overlaps the upper electrode 87, and is electrically connected thereto. A corner 171 of the light emitting element CHIP is covered with a second flattening layer 95. On the light emitting element CHIP, an overlapping region 74 where the second flattening layer 95 and the upper electrode 87 overlap each other is formed. Since the overlapping regions 74 are formed on both ends of the upper electrode 87, the second flattening layer 95 has a shape recessed on the upper electrode 87.

The transparent conductive film 76 has a configuration of a single layer or a plurality of layers of a conductive metal oxide. For example, a configuration in which an Ag or Ag alloy layer is sandwiched between conductive metal oxides such as ITO may be used. Further, the auxiliary conductor 75 including a metal layer may be stacked on the transparent conductive film 76. The auxiliary conductor 75 including a metal layer formed on the transparent conductive film 76 can decrease a resistance of the transparent conductive film 76 and contribute to dissipation of heat generated in the light emitting element CHIP.

Figure 18:
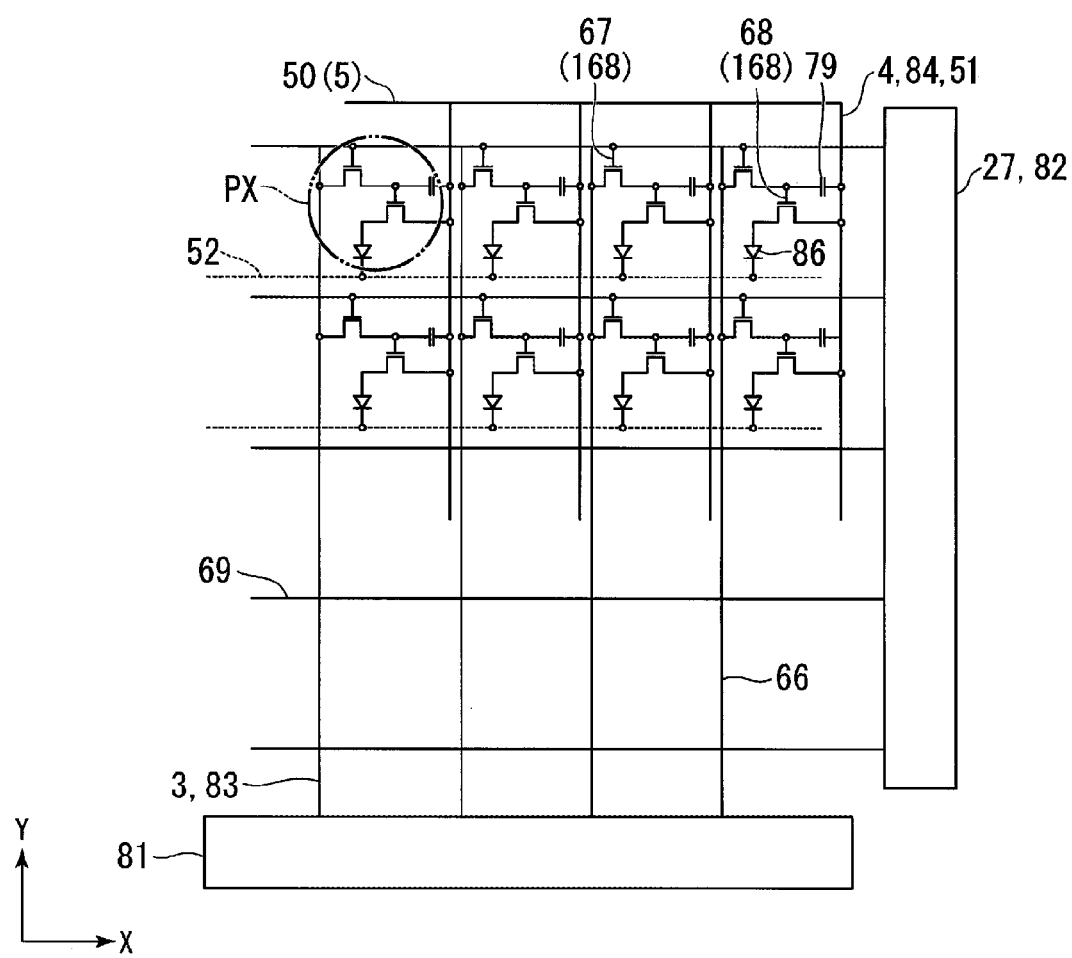
FIG. 18 is a representative circuit diagram including a thin film transistor configured to drive a light emitting diode element applied to the electronic device according to the first embodiment of the present invention.

The transparent conductive film 76 is the power supply line 52 shown in FIG. 18. The transparent conductive film 76 functions as a cathode or a common electrode of the light emitting element (light emitting diode or organic EL). In this case, the transparent conductive film 76, as a shield layer of the touch sensing unit 10, has an effect of reducing the influence of electrical noise generated from the system control unit 30 and the NFC communication unit 126.

For example, FIG. 11 shows that the second flattening layer 95 formed on the upper electrode 87 has a taper of an angle θ for the purpose of reducing the risk of disconnection of the transparent conductive film 76, and the transparent conductive film 76 is formed to extend along the tapered surface of the second flattening layer 95.

Specifically, the overlapping region 74 is located between the transparent conductive film 76 and the upper electrode 87 at the corner 171, and is inclined relative to the upper electrode 87 at the angle θ, for example, in the range of 5° to 70°. The overlapping region 74 thus inclined can prevent disconnection of the transparent conductive film 76.

In the state where an upper surface 78 (front layer) of the light emitting element CHIP protrudes from the second flattening layer 95 and does not overlap the second flattening layer 95, that is, where the overlapping region 74 is not formed, there may be a concern that the transparent conductive film 76 is subject to disconnection, causing lighting failure of the light emitting element CHIP.

The second flattening layer 95 having the recess described above, and the overlapping region 74 that overlaps the light emitting element CHIP are formed by known photolithography. Further, in addition to a known photolithography technique, dry etching technique and ultraviolet cleaning technique may also be applied.

The shape of the light emitting element CHIP may be, for example, a square having a side length in a range of 3 μm to 500 μm in plan view. However, shapes other than square and rectangle may also be applied. The length of a side may be 500 μm or more. Further, one or more light emitting elements can be mounted on the pixels PX, which are defined by the first wiring and the second wiring in plan view. In mounting of the light emitting element CHIP, the orientation of the light emitting element CHIP, for example, having a rectangular shape, can be randomly rotated in units of 90°. The random mounting can reduce unevenness in color and brightness over the entire screen caused by slight variation in LED crystal growth.

Examples of the n-type semiconductor and the p-type semiconductor that can be applied to light emitting elements such as LEDs include compounds of elements selected from the groups II to VI in the periodic table, and nitrides and oxides thereof. For example, a semiconductor in which GaN is doped with In, group II element, or group IV element, GaP, GaInP, AlGaInP, and a semiconductor in which ZnO is doped with group III element can be used. For example, an InGaN/GaN LED which emits near ultraviolet light with high efficiency in light emission can be used. An InGaN/GaN LED having a nanopillar structure can also be used by using the neutral beam etching technique together with the biotemplate technique. Further, the light emitting layer 92 may be formed of a single compound semiconductor, or may have a single quantum well structure or a multi-quantum well structure. For the light emitting element CHIP, red LEDs, green LEDs, and blue LEDs can be arranged in a matrix. Further, near infrared LEDs may also be added. Alternatively, a quantum dot layer as a wavelength conversion member may be stacked on a monochromatic LED light emitting element.

The lower electrode 88 may be made of a material such as silver, silver alloy, aluminum, or aluminum alloy. Further, the lower electrode 88 may have a configuration in which a silver or silver alloy layer is sandwiched between conductive metal oxide layers as described later. Part of the configuration of the lower electrode 88 may partially include a metal layer such as Ti layer, Cr layer, Pt layer, AuGe layer, Pd layer, Ni layer, TiW layer, or Mo layer, or a multilayer configuration including the conductive metal oxide layer described above. Further, by reducing the ratio of the area of the lower electrode 88 in plan view, a semi-transmissive or transmissive display device can be obtained. The upper electrode 87 preferably has a configuration including a layer made of a conductive metal oxide.

Examples of the conductive metal oxide include indium oxide as a base material, and various complex oxides such as tin oxide, zinc oxide, gallium oxide, titanium oxide, zirconium oxide, molybdenum oxide, tungsten oxide, magnesium oxide, antimony oxide, and cerium oxide, which is advantageous in ease of adjustment of characteristics required for the upper electrode 87. Such characteristics include a work function value, light transmissivity, refractive index, conductivity, etching processability, and the like. Part of the configuration of the upper electrode may include a metal layer such as Ti layer, Cr layer, Pt layer, AuGe layer, AuSn layer, Pd layer, Ni layer, TiW layer, or Mo layer, or a multilayer configuration including the conductive metal oxide layer described above. Further, since the upper surface 78 of the upper electrode 87 serves as a light-emitting surface, the area ratio of the transparent conductive metal oxide layer is preferably large. Further, the upper surface 78 (front layer) of the upper electrode 87 is preferably electrically connected to a sixth wiring having a structure in which a copper layer or a copper alloy layer is sandwiched between the conductive metal oxides in a region outside the light-emitting surface of the light emitting element CHIP.

A bank 94 may be provided using an organic resin such as acrylic resin, polyimide resin, or novolak phenol resin. Further, an inorganic material such as silicon oxide or silicon oxynitride may also be disposed on the bank 94.

A material of the first flattening layer 96 and the second flattening layer 95 may be acrylic resin, polyimide resin, benzocyclobutene resin, polyamide resin, or the like. A low dielectric constant material (low-k material) may also be used.

In order to improve display clarity, any of the first flattening layer 96, the second flattening layer 95, the sealing layer 109, and the second substrate 2 may have a light scattering function. Alternatively, a light scattering layer may be formed above the second substrate 2.

(Thin Film Transistor)

FIG. 10 illustrates an example of a structure of the thin film transistor (TFT) having a top gate structure used as an active element connected to the reflective electrode 89 (pixel electrode). Further, in FIG. 10, peripheral members such as the first substrate 1 and the third substrate 3 are omitted.

The second thin film transistor 68 (168) has a configuration including a channel layer 58, and a source electrode 54 and a drain electrode 56 which are stacked on the channel layer 58. Specifically, the second thin film transistor 68 includes the drain electrode 56 connected to one end of the channel layer 58 (first end, which is a left end of the channel layer 58 in FIG. 10), the source electrode 54 connected to the other end of the channel layer 58 (second end, which is a right end of the channel layer 58 in FIG. 10), and a gate electrode 55 disposed to face the channel layer 58 with the third insulating layer 13 therebetween. As described later, the channel layer 58 is formed of an oxide semiconductor, and in contact with the third insulating layer 13, which is the gate insulating layer. The second thin film transistor 68 drives the light emitting element CHIP. The details of the first thin film transistor 67 and the second thin film transistor 68 will be described later.

A tapered surface is not formed in the cross sections of superposed regions 31 and 32 of the channel layer 58, the electrode cross sections of the source electrode 54, the drain electrode 56, and the gate electrode 55 shown in FIG. 10. However, a tapered surface (inclined surface) is preferably formed for the purpose of avoiding disconnection of wiring or the like.

The source electrode 54 and the drain electrode 56 shown in FIG. 10 are concurrently formed in the same process. Further, the source electrode 54 and the drain electrode 56 include the same conductive layer having the same configuration. That is, in the first embodiment, the source electrode 54 (third wiring) and the drain electrode 56 (fourth wiring) each have a three-layer configuration in which a copper layer or a copper alloy layer (third conductive layer) is sandwiched between a first conductive metal oxide layer and a second conductive metal oxide layer. In addition, the source electrode 54 and the drain electrode 56 may have a three-layer structure of titanium/aluminum alloy/titanium, molybdenum/aluminum alloy/molybdenum, or the like. An aluminum-neodymium is a typical aluminum alloy. From the viewpoint of thermal conductivity, a copper layer or a copper alloy layer is preferably used as a wiring material. For electrical connection at the contact hole, an additional conductive metal oxide can be further stacked.

A back gate electrode may be provided in order to stabilize a threshold voltage (Vth) of the thin film transistor or obtain stable normally-off transistor characteristics. The back gate electrode can be formed by patterning a metal film so as to face the gate electrode 55 of FIG. 10 with the channel layer 58 interposed therebetween, for example, at the interface between the fourth insulating layer 47 and the second substrate 2. The back gate electrode formed of a metal film prevents external light being incident on the channel layer 58, obtaining a stable positive (plus) Vth. Usually, a negative voltage is applied to the back gate electrode. An electric field formed between the gate electrode 55 and the gate electrode can electrically surround the channel layer 58. This electric field can increase the drain current of the second thin film transistor 68, and also decrease a leakage current, which is the off current of the second thin film transistor 68. Therefore, the size of the second thin film transistor 68 can be relatively small for the drain current required for the second thin film transistor 68, which enables a highly integrated semiconductor circuit.

The second insulating layer 48 located under the gate electrode 55 may be an insulating layer having the same width as that of the gate electrode 55. In this case, for example, dry etching is performed by using the gate electrode 55 as a mask to remove the second insulating layer 48 around the gate electrode 55. Thus, an insulating layer having the same width as that of the gate electrode 55 can be formed. A technique of processing an insulating layer by dry etching using the gate electrode 55 as a mask is generally called self-alignment in thin film transistors having a top gate structure. Further, as shown in FIGS. 9 and 10, the first insulating layer 49 is provided on the second insulating layer 48 so as to cover the gate electrode 55. Further, the first flattening layer 96 is provided on the first insulating layer 49.

From the viewpoint of power consumption, driving of an LED using a thin film transistor having a channel layer formed of an oxide semiconductor is more preferable than driving of an LED using a thin film transistor having a channel layer formed of polysilicon semiconductor.

For example, oxide semiconductors called IGZO are collectively manufactured by vacuum deposition such as sputtering. After the oxide semiconductor is formed, heat treatment after the patterning of the TFT or the like is also collectively performed. Therefore, variations in electrical characteristics (for example, Vth) related to the channel layer are quite small. In driving of the LED, the variation in Vth of the thin film transistor needs to be minimized to reduce the variation in brightness of the LED. However, in order to ensure reliability by crystallization, the oxide semiconductor called IGZO described above typically undergoes heat treatment at the temperature in the range of 400° C. to 700° C. (high temperature annealing). In the production process of a liquid crystal display device or the like, interdiffusion of titanium and copper occurs during this heat treatment, which often significantly degrades the conductivity of the copper wiring. In order to prevent diffusion of copper, the oxide semiconductor is preferably made of a complex oxide mainly composed of two oxides, or indium oxide and antimony oxide, which can be annealed at a low temperature in the range of 180° C. to 340° C.

Further, since the thin film transistor having a channel layer formed of an oxide semiconductor has a quite small leakage current, high stability is obtained after the input of a scan signal and a video signal. A thin film transistor having a channel layer formed of a polysilicon semiconductor has a leakage current larger than that of an oxide semiconductor transistor by two orders of magnitude or more. A small leakage current is preferred since it contributes to highly accurate touch sensing.

An oxide semiconductor is a complex oxide including indium oxide and antimony oxide as main materials. Although an oxide semiconductor may be formed using a composition containing only indium oxide and antimony oxide, oxygen vacancies are likely to occur in an oxide semiconductor having such a composition. In order to reduce oxygen vacancies in the oxide semiconductor, it is preferred to further add an oxidation stabilizer including zirconium oxide, hafnium oxide, scandium oxide, yttrium oxide, lanthanum oxide, cerium oxide, neodymium oxide, samarium oxide, gallium oxide, titanium oxide, and magnesium oxide to an oxide semiconductor.

The above thin film transistor shown in FIG. 10 can be applied to an electronic device (see FIG. 22) according to the second embodiment described later.

(Antenna Unit)

Next, with reference to FIGS. 12 to 15, configurations of antenna units 110, 120, 130, and 140 constituting the electronic device E1 will be described.

Figure 12:
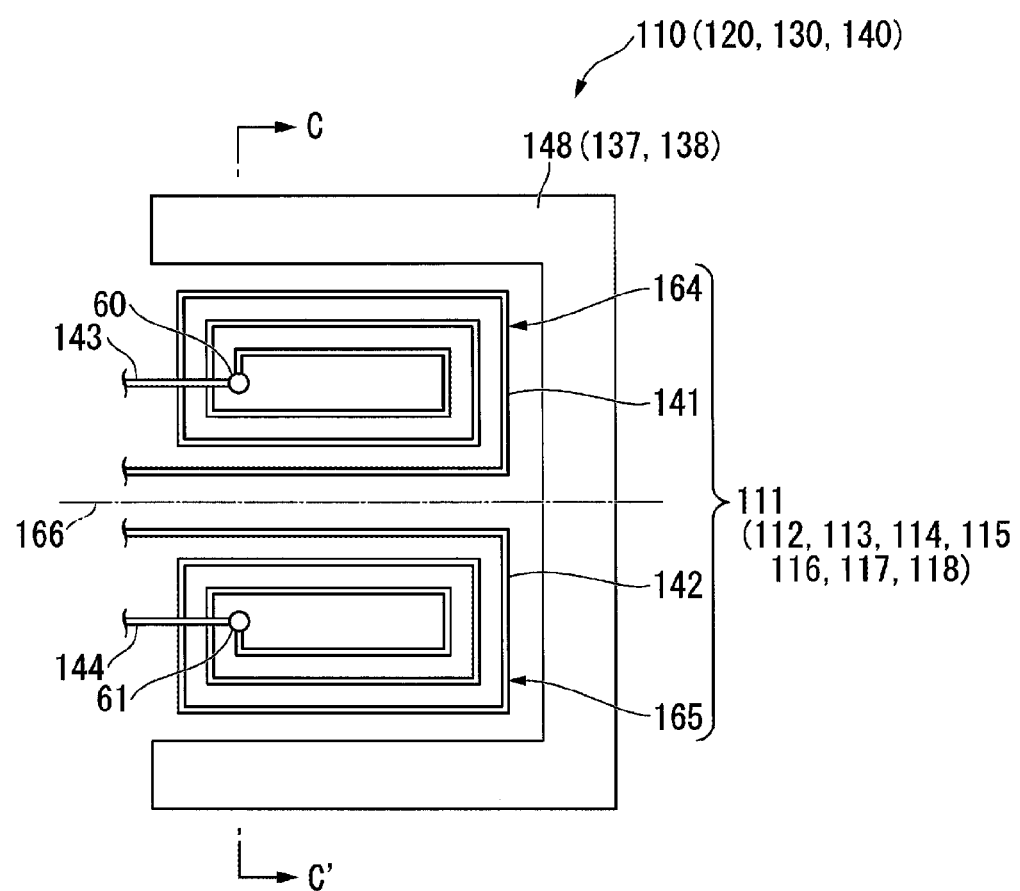
FIG. 12 is an enlarged partial plan view of the first antenna unit formed on the second surface of the first substrate constituting the electronic device according to the first embodiment of the present invention.

FIG. 12 is an enlarged partial plan view of the first antenna unit 110 formed on the second surface 42 of the first substrate 1 constituting the electronic device E1, showing one of two sets of loop antennas constituting the first antenna unit 110.

Figure 13:
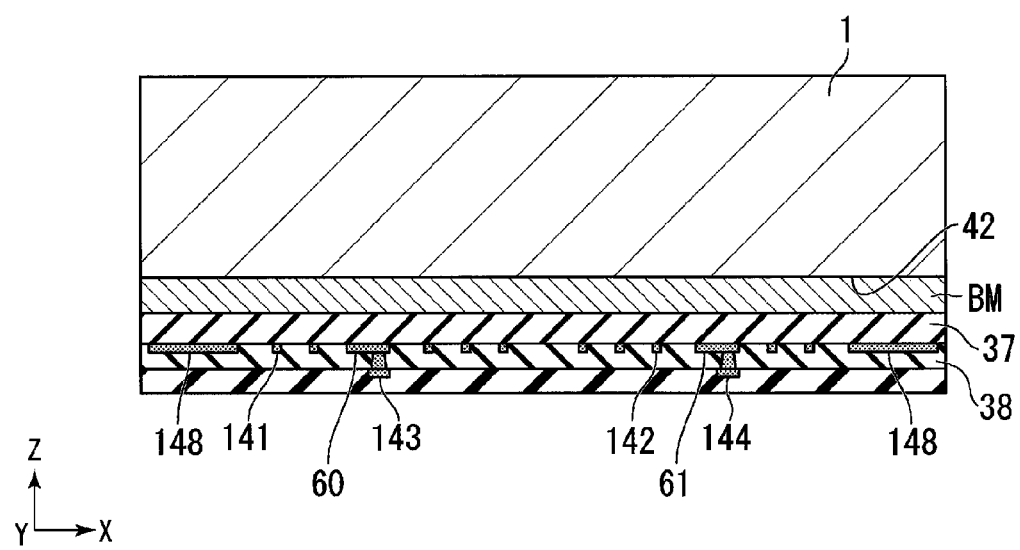
FIG. 13 is an enlarged view of the first antenna unit formed on the second surface of the first substrate constituting the electronic device according to the first embodiment of the present invention, showing a cross-sectional view of the first antenna unit taken along the line C-C' of FIG. 12.

FIG. 13 is an enlarged view of the first antenna unit 110 formed on the second surface 42 of the first substrate 1 constituting the electronic device E1, showing a cross-sectional view of the first antenna unit 110 taken along the line C-C' of FIG. 12.

Figure 14:
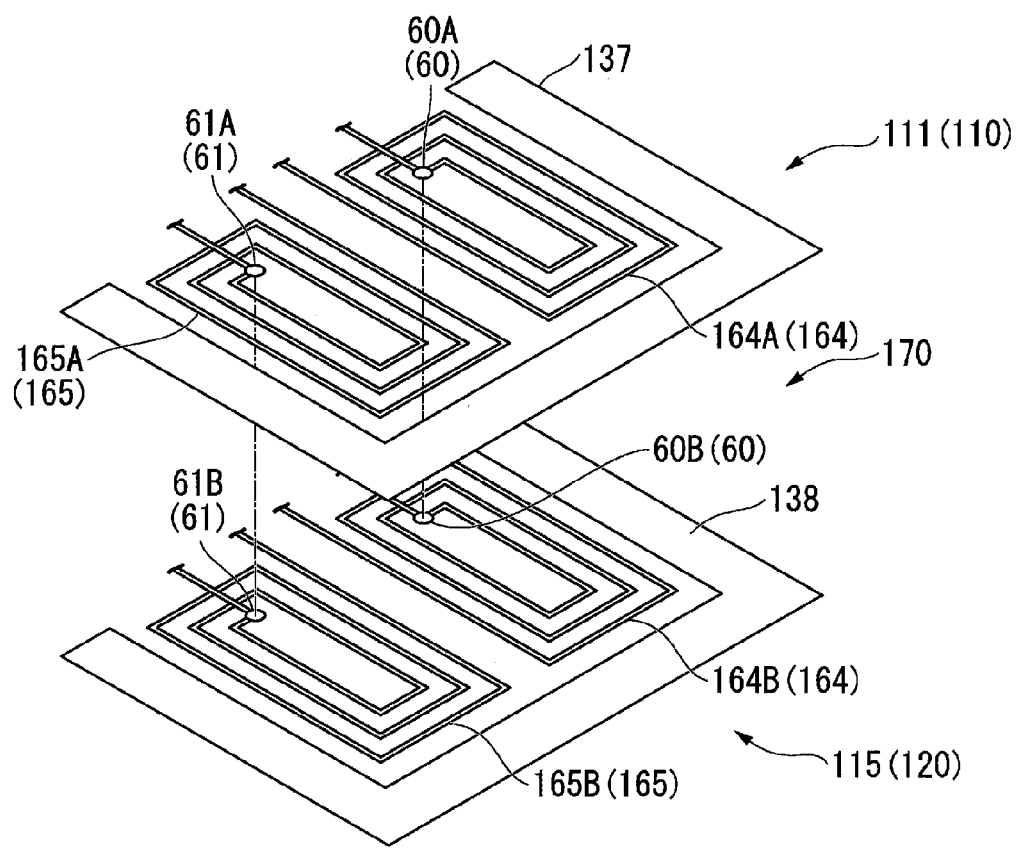
FIG. 14 is a perspective view illustrating how the first antenna unit formed on the second surface of the first substrate and a second antenna unit formed on a third surface of the second substrate constituting the electronic device according to the first embodiment of the present invention are superposed on each other.

FIG. 14 is a perspective view illustrating how the antenna pair of the first antenna unit 110 formed on the second surface 42 of the first substrate 1 and the antenna pair of the second antenna unit 120 formed on the third surface of the second substrate constituting the electronic device E1 are superposed on each other.

Figure 15:
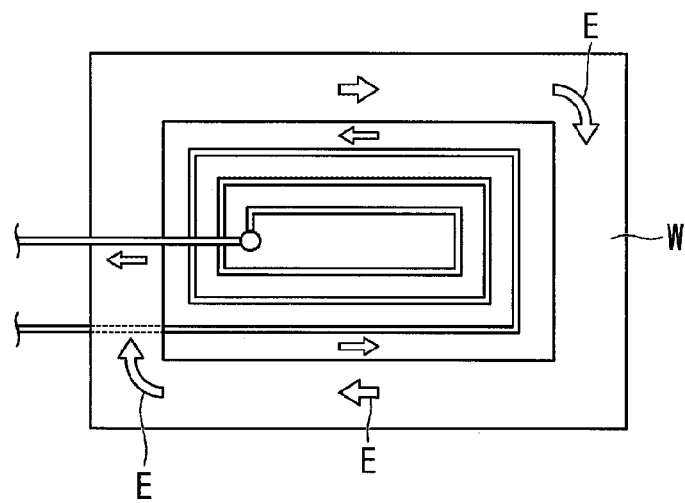
FIG. 15 is an explanatory view illustrating how an eddy current occurs when a loop antenna is surrounded by a conductor.

FIG. 15 is an explanatory view illustrating how an eddy current occurs when a small-diameter loop antenna is surrounded by a conductor.

The first antenna unit 110 includes two antenna pairs 111 and 112. The second antenna unit 120 includes two antenna pairs 113 and 114. The third antenna unit 130 includes two antenna pairs 115 and 116. The fourth antenna unit 140 includes two antenna pairs 117 and 118.

The following description refers to the structure of the antenna pair 111, which is one of two sets of antenna pairs 111 and 112 constituting the first antenna unit 110, as representative of the first antenna unit 110, the second antenna unit 120, the third antenna unit 130 and the fourth antenna unit 140. However, a similar structure can be employed in other antenna units as well.

Further, referring to FIG. 14, the description will be given of how the antenna pair 111 of the first antenna unit 110 and the antenna pair 115 of the second antenna unit 120 are superposed on each other as representative. However, a similar structure can be employed in superposition between the antenna pair 112 of the first antenna unit 110 and the antenna pair 116 of the second antenna unit 120, and superposition between the antenna pairs 113 and 114 of the third antenna unit 130 and the antenna pairs 117 and 118 of the fourth antenna unit 140, respectively. In the following description, these antenna units may be each simply referred to as an "antenna unit".

As shown in FIG. 12, the antenna pair 111 is composed of a pair of small-diameter loop antennas 164 and 165 whose number of turns is 2 or more and whose wiring directions are opposite to each other. The small-diameter loop antennas 164 and 165, each wound in directions opposite to the other, have line-symmetric patterns to a center line 166.

The small-diameter loop antenna 164 includes a loop wire 141 and a lead wire 143 having the same layer structure as that of the conductive wiring described above. The loop wire 141 is electrically connected to the lead wire 143 via a connection pad 60.

Similarly, the small-diameter loop antenna 165 includes a loop wire 142 and a lead wire 144 having the same layer structure as that of the conductive wiring described above. The loop wire 142 is electrically connected to the lead wire 144 via a connection pad 61.

Further, in the antenna unit according to the embodiments of the present invention, a substantially U-shaped conductive pattern 148 (137, 138) is provided so as to surround the small-shaped loop antennas 164 and 165 as described later.

The conductive wiring constituting the antennas may have a three-layer configuration in which the copper alloy layer is sandwiched between conductive metal oxide layers as described above. For example, the first antenna unit 110 can be formed in the same layer and by the same process as the first conductive wiring 21 (or second conductive wiring 22). The third antenna unit 130 can be formed in the same layer and by the same process as the source wiring 66 (or gate wiring 69). The above conductive wiring may have a multilayer configuration of two or more layers including copper or copper alloy and a high melting point metal such as titanium.

Specifically, in the first antenna unit 110, the first conductive wiring 21 (gate electrode 155, and the like), the loop wires 141 and 142, and the conductive pattern 148 are all patterned on the fourth insulating layer 37 as shown in FIG. 13. Further, after the fifth insulating layer 38 is formed so as to cover the loop wires 141 and 142, contact holes are formed at positions of the connection pads 60 and 61. The second conductive wiring 22 (drain electrode 156, source electrode 154, and the like), and the lead wires 143 and 144 are all patterned on the fifth insulating layer 38. With this configuration, the lead wires 143 and 144 are electrically connected to the loop wires 141 and 142 via the connection pads 60 and 61, respectively.

The "antenna unit" according to the embodiments of the present invention refers to a configuration in which two or more small-diameter loop antennas each wound in directions opposite to the other are alternately positioned adjacent to each other on the same plane for transmitting and receiving a touch sensing signal or of receiving and supplying power. The "signal" herein means a communication signal including a signal related to touch sensing and a signal related to image display on the display functional layer. When the antenna unit has an antenna structure of a loop shape (a coil shaped or helical planar pattern formed on the same plane), it is preferred that two antennas each wound in directions opposite to the other are adjacent to each other in order to ensure stable communication.

Two or more antennas each wound in directions opposite to the other can be alternately placed adjacent to each other and one set of antennas selected therefrom may be used. The loop antenna having a loop-shaped pattern in the antenna unit is hereinafter referred to as a "small-diameter loop antenna." Accordingly, the "antenna" in the above "antenna unit" may be replaced with a small-diameter loop antenna. The "small-diameter" of the small-diameter loop antenna means a size smaller than that of the loop antenna 128 shown in FIG. 7, but does not limit the size of the loop antenna in the embodiment of the present invention.

Next, as shown in FIG. 14, the antenna pair 111 of the first antenna unit 110 and the antenna pair 115 of the second antenna unit 120 are superposed on each other such that the small-diameter loop antennas 164A and 164B having the same winding direction are aligned and superposed on each other and the small-diameter loop antennas 165A and 165B having the same winding direction are aligned and superposed on each other (superposed region 170).

In the superposed region 170, the positional accuracy of an antenna is preferably within ±3 µm because the conductive wiring forming the antenna are narrow, e.g., 1 µm to 500 µm wide and the antenna unit has to fit in a narrow frame region 72. Higher accuracy in positional alignment enables more efficient signal transmission and reception. Connecting two or more small-diameter loop antennas in parallel enables small-sized and low-impedance antennas and fast wireless data transfer. In FIGS. 12 to 14, capacitors and other components for forming a resonant circuit between the first antenna unit 110 and the second antenna unit 120, and a resonant circuit between the third antenna unit 130 and the fourth antenna unit 140 are not illustrated.

Each of the first antenna unit 110, the second antenna unit 120, the third antenna unit 130, and the fourth antenna unit 140 are composed of an antenna pair having a pair of small-diameter loop antenna, each of which is wound in directions opposite to the other. Each of the small-diameter loop antennas wound in directions opposite to the other generates a magnetic field in a direction opposite to the other, enabling stable transmission and reception with less noise. In other words, a pair of small-diameter loop antennas, each wound in directions opposite to the other, forms magnetic fields oriented in directions opposite to the other, and creates a shielding effect against an external magnetic field, which can reduce the influence of external noise. In the antenna unit shown in FIG. 12, since the small-diameter loop antennas 164 and 165, each wound in directions opposite to the other, have line-symmetric patterns to the center line 166, it is possible to cancel the noise due to an external magnetic field and enhance the shielding effect.

Preferably, the loop antenna or the small-diameter loop antenna is wound twice or more, or 3 times or more. For example, when the antenna measures 10 mm or less, the number of turns may be in a range of 3 or more and 20 or less. In the first embodiment, the number of turns is 3. In plan view, a loop antenna wound twice or more assumes a curve that comes close to the center of the loop antenna in the same plane. An Archimedean spiral with substantially equally spaced lines is a typical example. The shape of the above loop antenna is synonymous with that of the spiral antenna that can be mounted on a plane described later.

In general, for ensuring a long communication distance, a loop antenna represented by RFID requires the following three points:

(a) increase the number of turns;

(b) ensure a large antenna diameter such as a card size with the assumption of a frequency of, for example, 13.56 MHz; and (c) ensure sufficient conductivity of the conductive wiring.

The antenna diameter herein is based on the average value of the long axis and the short axis in plan view of the antenna. On the other hand, the communication distance of the small-diameter loop antenna according to the embodiments of the present invention may be set in consideration of the thickness of the sealing layer used for the organic EL layer, the thickness of the liquid crystal layer, or the thickness of the substrate such as a glass. Since the distance may be small such as, for example, in a range of approximately 1 µm to 10000 µm, the above limitation is almost eliminated. In other words, since the communication distance of the small-diameter loop antenna according to the embodiments of the present invention may be small, such as in a range of approximately 1 µm to 10000 µm, unlike a common RFID, it is possible to significantly reduce the influence of noise on the drive circuit of the display functional layer, and the like. Since the small-diameter loop antenna according to the embodiments of the present invention has a low far-field radiation intensity, the antenna is subject to almost no legal restrictions on the resonance frequency of a typical antenna.

A plurality of loop antennas or small-diameter loop antennas can be disposed on the same plane such that antennas (loop antennas or small-diameter loop antennas) each wound in different directions from each other are alternately arranged in parallel. The plurality of antennas connected in parallel can reduce the impedance of the antenna.

The resonance frequency of the small-diameter loop antenna according to the embodiments of the present invention may be a frequency suitable for touch sensing, and, for example, n times the touch sensing driving frequency (n is an integer of 1 or more) can be selected.

On the other hand, in order to mitigate the influence of noise from a drive circuit of the display functional layer or the like or an external power supply such as 100V or 220V, the small-diameter loop antennas 164 and 165 are preferably planarly surrounded by the conductive patterns 137 and 138 in a substantially U-shape as shown in FIGS. 12 and 14. The small-diameter loop antennas 164 and 165, each wound in directions opposite to the other, may be referred to as an antenna pair.

If the conductive pattern has, for example, an electrically closed shape W (electrically connected shape) as shown in FIG. 15, a current E flows in the conductive pattern in the direction opposite to that of a current flowing in the small-diameter loop antenna, leading to a reduced efficiency of the small-diameter loop antenna. Therefore, the conductive patterns 137 and 138 preferably have a substantially U-shape that partially surrounds the antenna pair (a pair of small-diameter loop antennas), rather than an annular shape that encloses the antenna or the antenna pair. The conductive patterns 137 and 138 may be grounded to the housing or the like of the display device.

The conductive patterns 137 and 138 preferably have a structure in which a copper layer or a copper alloy layer is sandwiched between the first conductive metal oxide layer and the second conductive metal oxide layer as described above.

The conductive patterns 137 and 138 may be made of a metal having good thermal conductivity to thereby impart an effect of dissipating heat (a role as a heat dissipation fin) generated in the small-diameter loop antenna.

For example, each of the small-diameter loop antennas 164 and 165 can be a pair of antennas each wound in directions opposite to the other in plan view. The opposite winding directions can be defined as the winding directions of the small-diameter loop antennas 164 and 165 located at the upper and lower positions (or at the left and right positions) in FIG. 12, which are line-symmetric about the center line 166 in plan view. Two small-diameter loop antennas, which are adjacent to each other and wound in directions different from each other, form magnetic fields opposite to each other when power (or a signal) is applied. In other words, in two small-diameter loop antennas, which are adjacent to each other and wound in directions different from each other, currents flow in rotation directions opposite to each other. Further, the number of antenna pairs (the number of pairs) composed of two small-diameter loop antennas each wound in opposite directions is not limited to one, and a plurality of antenna pairs may be provided for each antenna unit. For example, the antennas each wound in directions opposite to the other, when alternately arranged electrically in parallel, can reduce the impedance of the antenna unit.

In the superposed region 170, which is a region where the antenna pair 111 of the first antenna unit 110 and the antenna pair 115 of the second antenna unit 120 are superposed, for example, a touch driving signal from the system control unit 30 is received, or a touch detection signal outputted from the touch detection switching circuit 19 via the touch signal transmission and reception control unit 20 is transmitted to the system control unit 30. The touch driving signal drives the touch driving switching circuit 18 via the touch driving controller 17. In other words, the superposed region 170 between the antenna pair 111 of the first antenna unit 110 and the antenna pair 115 of the second antenna unit 120 has a function of transmitting and receiving a touch sensing signal.

In the region where the antenna pair 112 of the first antenna unit 110 and the antenna pair 116 of the second antenna unit 120 are superposed (superposed region), for example, power supplied from the secondary battery 124 via the system control unit 30 is received. In other words, the superposed region between the antenna pair 111 of the first antenna unit 110 and the antenna pair 115 of the second antenna unit 120 has a function of supplying and receiving a power signal.

The role of the superposed region between one of the antenna pairs in the first antenna unit 110 and one of the antenna pairs in the second antenna unit 120, and the role of the superposed region between the other of the antenna pairs in the first antenna unit 110 and the other of the antenna pairs in the second antenna unit 120 can be exchanged. A capacitor for resonance is not shown in the drawing.

The electronic device E1 according to the first embodiment of the present invention can perform transmission and reception of a signal related to touch sensing, supply and reception of power required for touch sensing, and transmission and reception of a signal related to driving of the display functional layer in a wireless manner by using the antenna units.

In addition, external communication with the electronic device E1 and supply of power from an external power supply to the electronic device E1 can be performed by using the loop antenna 128 provided on the third substrate 3.

Therefore, a mounting structure using the conventional FPC (flexible print substrate) can be omitted in each of the first substrate, the second substrate, and the third substrate. Moreover, the width of the frame region 72 in the display device can be reduced, and assembly of the electronic device can be simplified.

(Magnetic Layer)

As shown in FIGS. 7 and 8, the magnetic layer 131 is provided on the fifth surface 45. For example, when a metal layer laminated on a package (secondary battery casing) of a lithium battery, which is the secondary battery 124, is disposed at a position near the loop antenna 128, the magnetic layer 131 can be used for improving the antenna efficiency.

Figure 16:
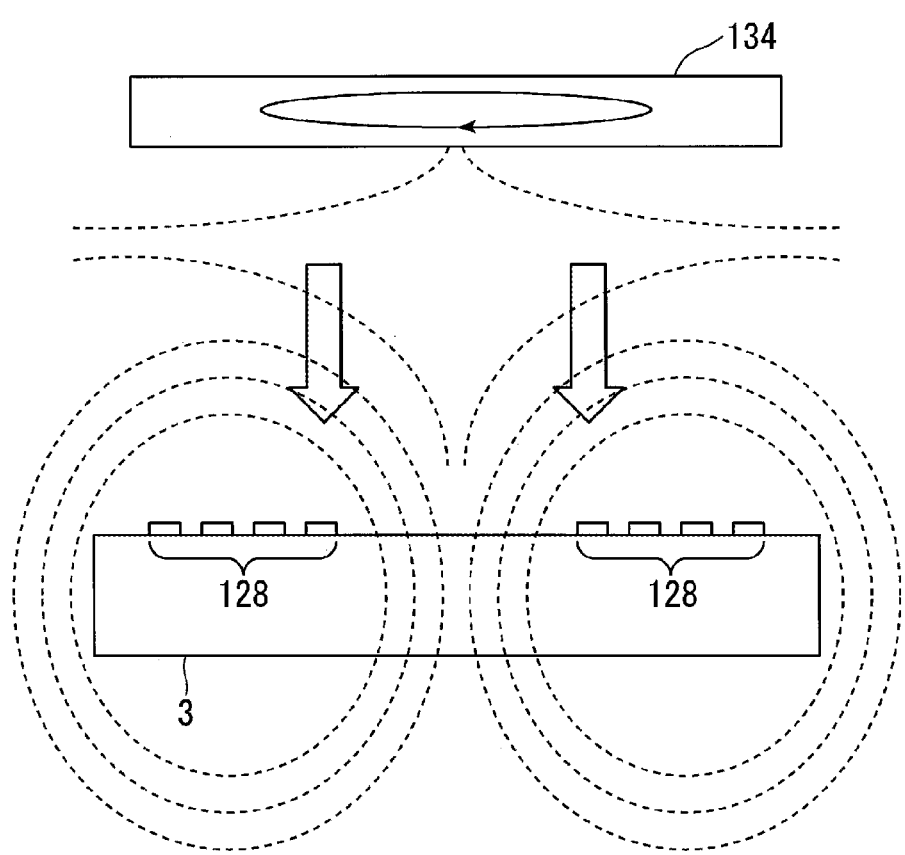
FIG. 16 is an explanatory view illustrating an influence of a metal layer constituting a secondary battery casing on a magnetic flux loop, schematically showing distortion of the magnetic flux loop due to unnecessary radiation waves.

FIG. 16 is an explanatory view illustrating a case where a metal layer 134 is disposed at a position facing the loop antenna 128, schematically showing distortion of the magnetic flux loop due to unnecessary radiation waves.

When the cradle 150, which is a charging stand, or a reader/writer of an RF-ID is actuated to form a magnetic field (magnetic flux loop) in the loop antenna 128, an eddy current is generated in the metal layer 134 in a direction in which the magnetic field is canceled, and an opposing magnetic field is concurrently formed. Therefore, a magnetic flux loop of the loop antenna 128 has distortion, reducing the antenna efficiency. The metal layer 134 shown in FIG. 16 refers to, for example, a resin-laminated metal package of a lithium battery or the like, or a conductive layer of a solid lithium battery or the like.

Figure 17:
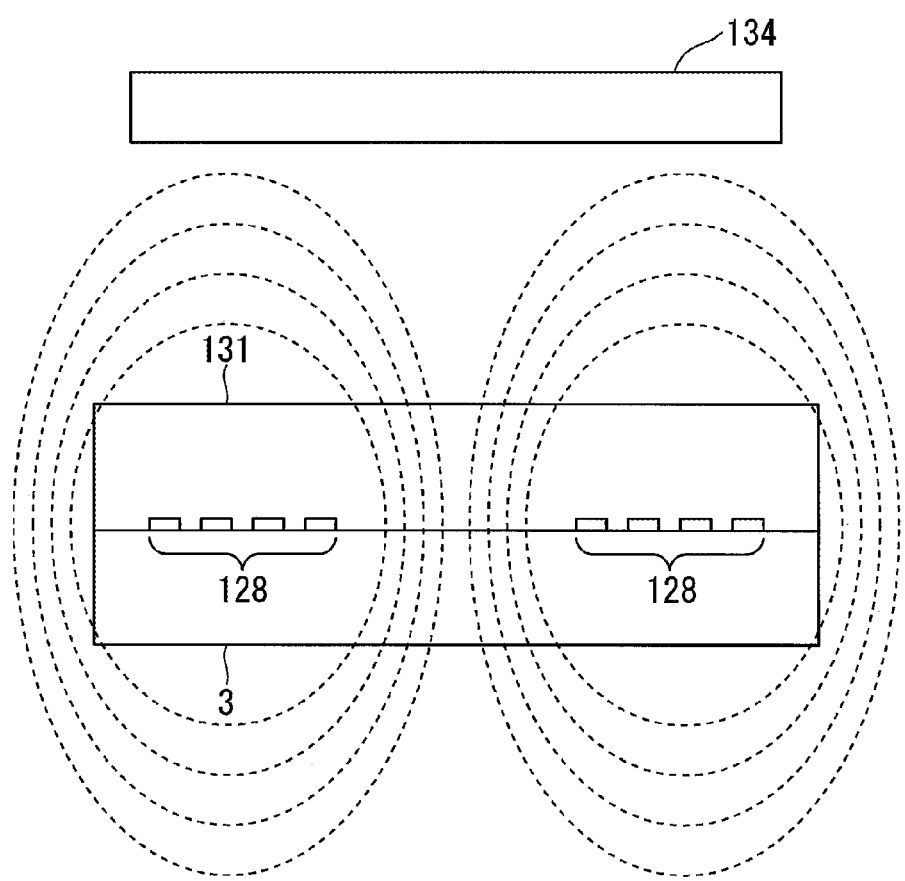
FIG. 17 is a view illustrating a magnetic flux loop shape when a magnetic layer is added between a metal layer and a loop antenna.

FIG. 17 is a view illustrating a magnetic flux loop shape when a magnetic layer 131 is disposed between the metal layer 134 and the loop antenna 128.

As shown in FIG. 17, when the magnetic layer 131 is provided between the metal layer 134 and the loop antenna 128, the shape of magnetic flux loop can be maintained and the antenna efficiency can be improved.

Structures and materials applicable to the magnetic layer 131 include a structure in which a sheet obtained by allowing a material such as Ni—Zn ferrite, Mn—Zn ferrite, Fe—Si based amorphous material, or Fe—Ni based permalloy to be dispersed or oriented in a synthetic resin or a rubber is processed in a desired shape. Alternatively, an amorphous film made of the above materials may be formed on the fifth surface 45 by vacuum deposition. The magnetic layer formed of an amorphous film can be suitably used for an all-solid-state electronic device in the case such as where a secondary battery is applied to a solid-state lithium battery.

(Driving of Light Emitting Diode Element)

FIG. 18 is a representative circuit diagram for driving a light emitting diode element using a thin film transistor. In the first embodiment of the present invention, an LED or an organic EL element is illustrated as the light emitting diode element. A plurality of pixels PX are arranged in a matrix. Hereinafter, the pixel PX may also be referred to as a pixel opening PX.

In FIG. 18, which schematically illustrates the plurality of pixels PX, each pixel PX is a pixel opening PX defined by the source wiring 66, which is a video signal line, and the gate wiring 69, which is a scanning line. The first conductive wiring 21 and the gate wiring 69 extend parallel in the X direction.

The source wiring 66 extends in the Y direction parallel to the second conductive wiring 22. In plan view, for example, the source wiring 66 is parallel to the second conductive wiring 22, and the first conductive wiring 21 is superposed on the gate wiring 69. The second thin film transistor 68 is connected to the first power supply line 51 via the source electrode 54. The first power supply line 51 is a power supply line for supplying power to the light emitting element 86. The second power supply line 52 is connected to the upper electrode 87 which constitutes the light emitting element 86 (light emitting diode element) via the transparent conductive film 76 and the auxiliary conductor 75. The second power supply line 52 is maintained at a constant electrical potential, and may be grounded to, for example, a ground (housing, or the like). The first conductive wiring 21 and the second conductive wiring 22 may be configured such that their extending directions are changed by 90°. The auxiliary conductor 75 can be made of metal wiring having good conductivity, and can be formed at positions superposed on the first conductive wiring 21 and the second conductive wiring 22 in plan view while avoiding the pixel openings (pixels PX). The auxiliary conductor 75 shown in FIG. 9 has a layer configuration of a conductive metal oxide, a copper alloy, and a conductive metal oxide. Using copper or copper alloy having good thermal conductivity for part of the configuration of the auxiliary conductor 75 facilitates heat dissipation of the light emitting diode element so that stable light emission can be obtained.

As shown in FIG. 18, the first thin film transistor 67, the second thin film transistor 68, the light emitting element 86 (corresponding to the light emitting element CHIP), the capacitive element 79, and the like are disposed in the pixel PX (pixel opening) defined by the source wiring 66 and the gate wiring 69.

The first thin film transistor 67 is electrically connected to the source wiring 66 and the gate wiring 69. The second thin film transistor 68 is electrically linked to the first thin film transistor 67 and the first power supply line 51, and receives a signal from the first thin film transistor 67 to drive the light emitting element 86, which is a vertical light emitting diode. In the present embodiment, the first thin film transistor 67 and the second thin film transistor 68 may be referred to as a thin film transistor 168. The thin film transistor 168 constitutes the thin film transistor array.

FIG. 18 illustrates main electric elements including the first power supply line 51 disposed on the second surface 43 of the second substrate 2. The plurality of pixels PX arranged in a matrix form the effective display region 71. In addition to the thin film transistors 67 and 68 shown in FIG. 18, a thin film transistor for resetting capacitance, a reset signal line, and the like may be additionally provided as a switching element on the second surface 43 of the second substrate 2. The light emitting element 86 is a vertical light emitting diode described above.

The gate wiring 69 is connected to a scan driving circuit 82 (gate signal switching circuit, display function driving unit 7) including a shift register, whereas the source wiring 66 is connected to a source signal switching circuit including a shift register, a video line, and an analog switch. A source signal circuit 81 and a scan driving circuit 82 receive a signal from the display control unit to control the light emitting element 86, which is a display functional layer.

In the present embodiment, the first power supply line 51 and the source wiring 66 extend in the Y direction (second direction), and are parallel to the second conductive wiring 22 described above. Further, the gate wiring 69 extends in the X direction (first direction), and is parallel to the first conductive wiring 21 described above.

In the embodiments of the present invention, positional relationship among the first conductive wiring 21, the second conductive wiring 22, the source wiring 66, the gate wiring 69, and the power supply lines are not limited.

For example, the power supply line 51 and the source wiring 66 may also be parallel to the first conductive wiring 21. The number of thin film transistors in each pixel or the orientation of the auxiliary conductor 75 can be varied to change the direction of pattern of the transparent conductive film.

In each of the plurality of pixels PX, when the first thin film transistor 67 is turned ON by receiving a gate signal from the gate wiring 69 and a video signal from the source wiring 66, an ON signal is supplied to the gate electrode 55 of the second thin film transistor 68 that supplies power to the pixel. As a current flows from the first power supply line 51 to the light emitting element 86 via the channel layer 58 of the second thin film transistor 68, the pixel PX (light emitting element 86) emits light according to the amount of the current.

Further, a signal (an output from the drain electrode) from the first thin film transistor 67, which is a switching transistor, is outputted to the gate electrode 55, which is formed by a contact hole and a fourth conductive layer, which are not shown. As the second thin film transistor 68, which is a driving transistor, receives a signal from the gate electrode 55, and supplies power from the first power supply line 51 to the light emitting element 86, the light emitting element 86 emits light according to the amount of the current.

Modification of First Embodiment

In the above embodiment, the light emitting element CHIP has been described as a structure in which a plurality of red LEDs, green LEDs, and blue LEDs are arranged in matrix. The present invention is not limited to the above structure of the first embodiment. For example, a modified example described below can be adopted.

A blue light emitting diode or a blue-violet light emitting diode as the light emitting element CHIP is disposed on the second substrate 2. After the blue light emitting diode or the blue-violet light emitting diode is disposed thereon, a green phosphor is disposed thereon for the green pixel, and a red phosphor is disposed thereon for the red pixel. Thus, an inorganic LED can be conveniently formed on the second substrate 2. When such phosphors are used, green light and red light are emitted from the green phosphor and the red phosphor, respectively, due to excitation by light emitted from the blue-violet light emitting diode.

An ultraviolet light emitting diode as the light emitting element CHIP may be disposed on the second substrate 2. Then, a blue phosphor is provided for the blue pixel, a green phosphor is provided for the green pixel, and a red phosphor is provided for the red pixel. When such phosphors are used, green pixels, red pixels, or blue pixels can be formed by a convenient technique such as printing. In view of light emission efficiency and color balance of the respective colors, the size of pixel, or the number of light emitting elements CHIP, and the area thereof for each pixel are preferably adjusted.

In production process of LED elements using a sapphire substrate or the like, the peak emission wavelengths of the light emitting elements may not be uniform due to in-plane variation of the sapphire substrate. Further, depending on the production lot, unevenness in peak emission wavelengths and unevenness in light emission due to slight shift of crystal axes may occur. Variations in crystal axes and crystal growth cause deviation in light emitted from the light emitting layer of the light emitting element, and thus deviation in viewing angle characteristics of the display device. In order to reduce such variations, a plurality of light emitting elements of the same color can be disposed in each pixel.

Further, in inspection of the second substrate 2 on which the light emitting elements CHIP are arranged in a matrix, near ultraviolet LEDs, ultraviolet LEDs, or blue LEDs can be used as a light source. By irradiating the second substrate 2 with light from the light source, excited light from the LEDs (light emitting elements CHIP) can be used. If necessary, a lambda converter may be incorporated in advance in the light source, and excited light from the red LEDs, green LEDs, and blue LEDs as light emitting elements CHIP can be used for observation and chip defect inspection. In the inspection using excited light, the light emitting elements CHIP can be examined for defects in light emission, appearance defects such as chipping, and the like.

(Circuit Formation by Thin Film Transistor)

In the above embodiment, a resistive element can be formed by patterning the film of the conductive metal oxide layer or the oxide semiconductor film in a desired pattern. Further, after a matrix of the thin film transistors (active elements) using a polysilicon semiconductor as a channel layer is formed on the second substrate 2, a matrix of the thin film transistors (active elements) using an oxide semiconductor as the channel layer can be disposed thereon with a through-hole formed in the insulating layer therebetween. In the two-layer configuration in which the matrix of the thin film transistor using an oxide semiconductor is disposed on the matrix of the thin film transistors using a polysilicon semiconductor as a channel layer, for example, layers of the gate wiring and the gate electrode of the polysilicon thin film transistor and wiring layers of the source wiring, the source electrode, and the drain electrode of the oxide semiconductor thin film transistor can be formed of the same material, in the same configuration, and as the same layer by patterning the common layer.

An inverter circuit and an SRAM can be formed by a well-known technique with a resistive element and an n-type thin film transistor. Similarly, a logical circuit such as a ROM circuit, a NAND circuit, a NOR circuit, a flip-flop, a shift register, and the like can be formed. Oxide semiconductors can form a power-saving circuit since they have a very small leakage current. Further, oxide semiconductors can provide a good memory element since they have memory properties (voltage retention properties) that silicon semiconductors do not have. Alternatively, the above memory elements and logic circuits can be formed by using a layer configuration in which an active element matrix using a polysilicon semiconductor as a channel layer is formed as a first layer and an active element matrix using an oxide semiconductor as a channel layer is formed as a second layer on the second substrate 2. If necessary, the channel layer may also be formed of a polysilicon semiconductor or an amorphous silicon semiconductor.

With the above technique, a circuit including a switching element can be formed on the second surface of the first substrate 1 and the third surface of the second substrate 2.

Second Embodiment

A second embodiment of the present invention will be described below with reference to the drawings.

In the second embodiment, the same members as those of the first embodiment will be referred to by the same reference signs and the description thereof will be omitted or simplified.

Figure 19:
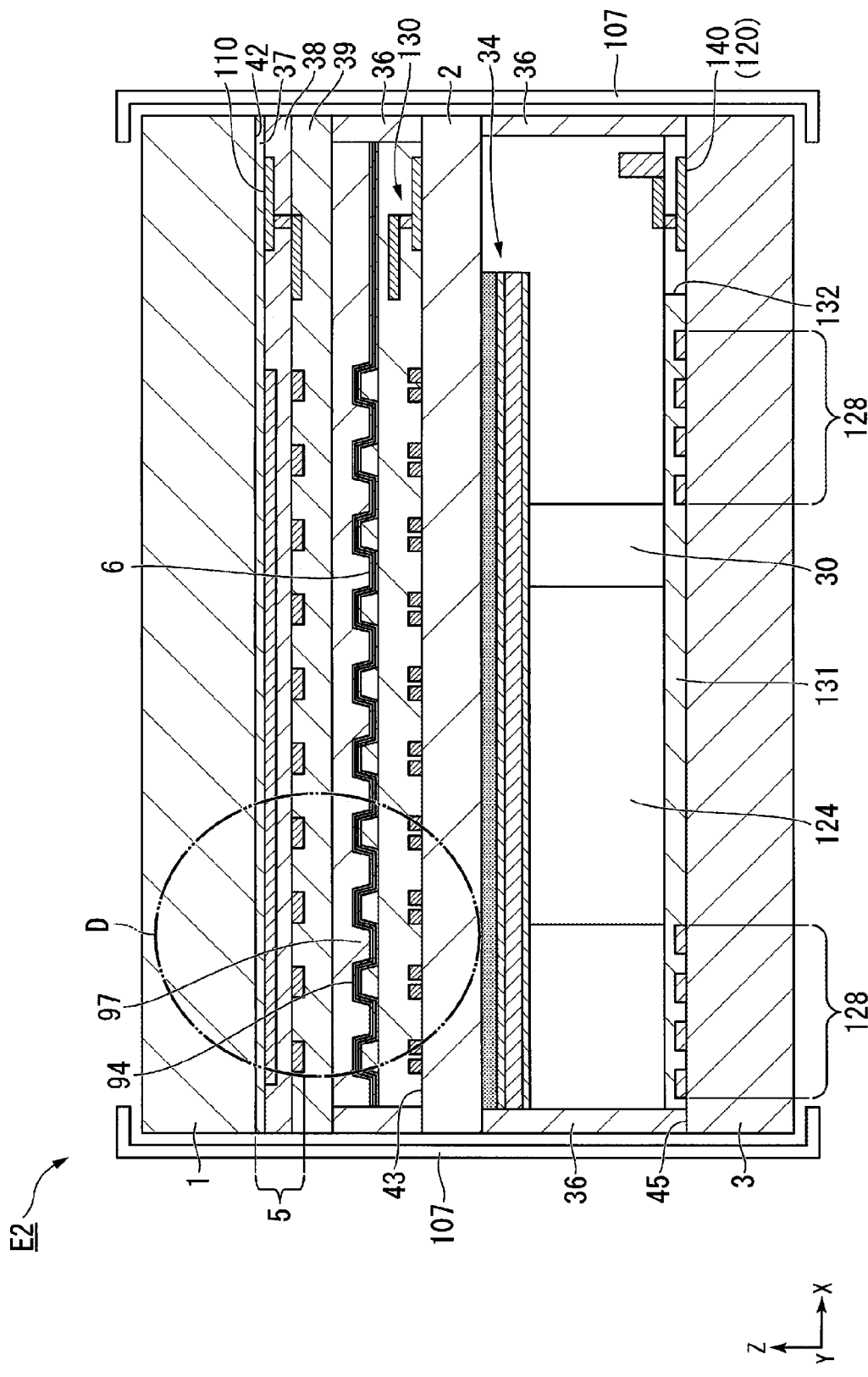
FIG. 19 is a cross-sectional view illustrating an electronic device according to a second embodiment of the present invention, showing a structure in which an organic EL layer is used as a display functional layer.

FIG. 19 is a cross-sectional view of an electronic device E2 according to a second embodiment of the present invention.

Figure 20:
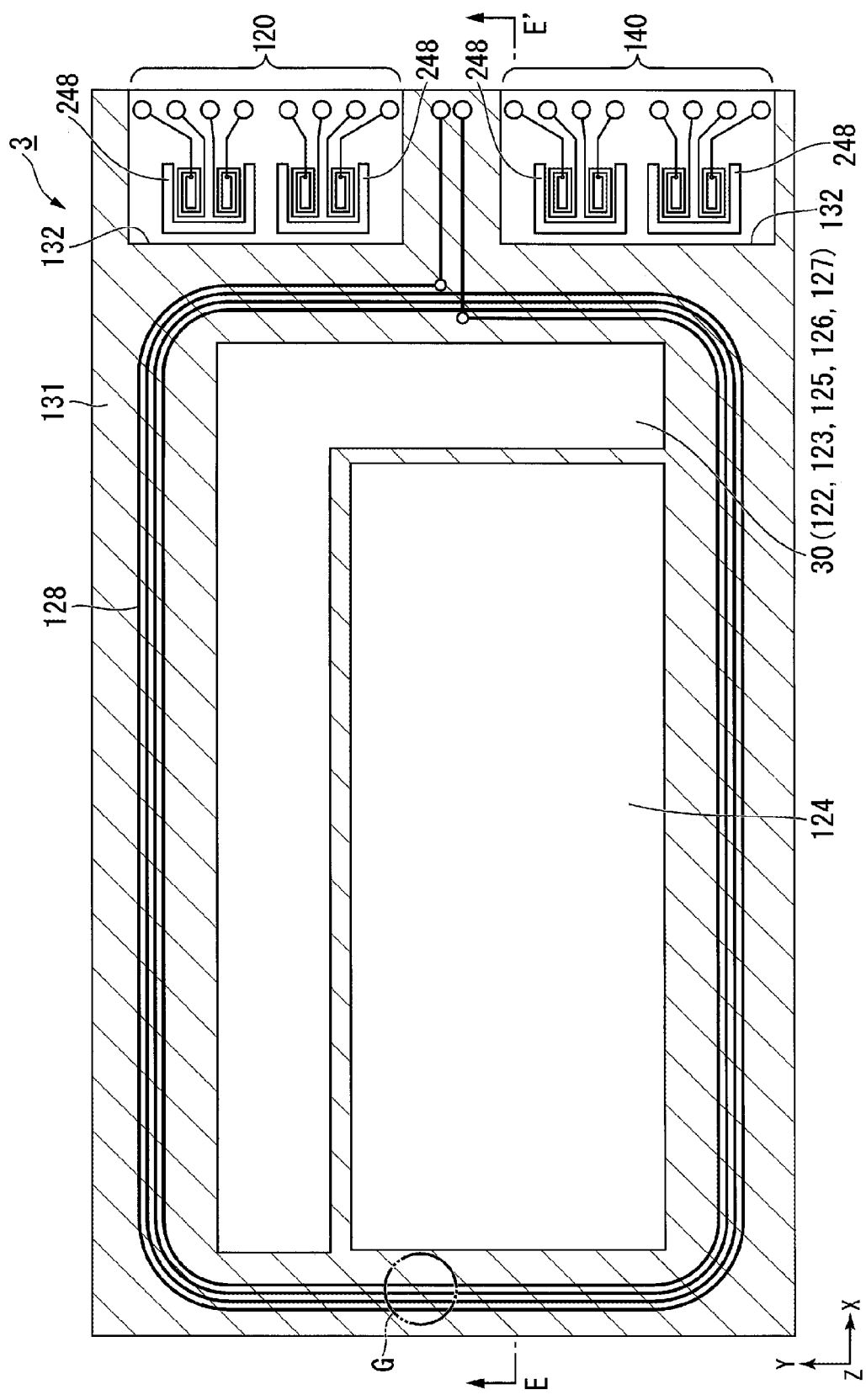
FIG. 20 is a plan view illustrating a third substrate included in the electronic device according to the second embodiment of the present invention.

FIG. 20 is a plan view illustrating a third substrate included in the electronic device E2.

Figure 21:
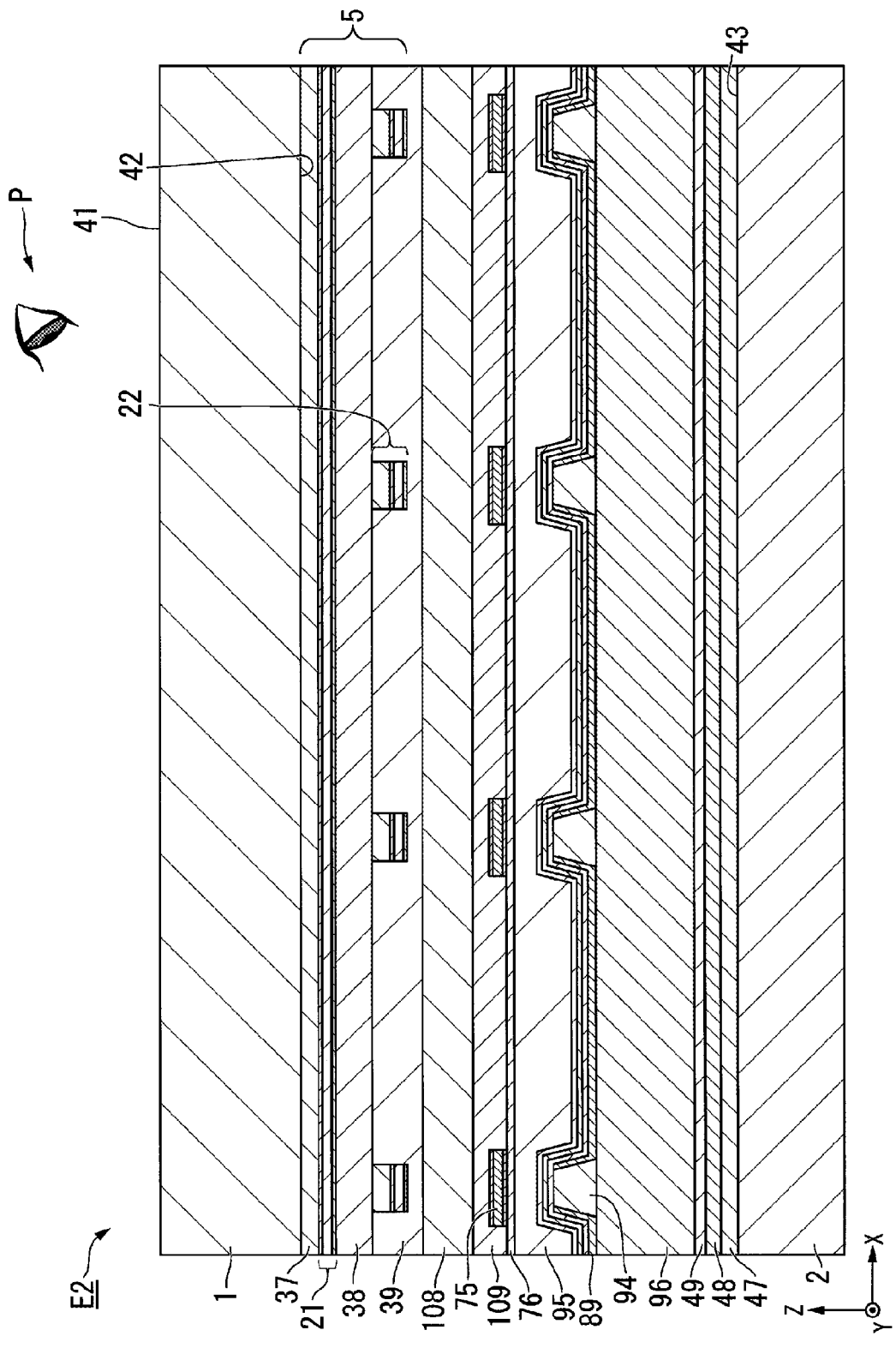
FIG. 21 is a cross-sectional view partially illustrating the electronic device according to the second embodiment of the present invention, showing an enlarged view of a region indicated by reference sign D of FIG. 19.

FIG. 21 is a cross-sectional view partially illustrating the electronic device E2, showing an enlarged view of a region indicated by reference sign D of FIG. 19, taken along the X direction. In FIG. 21, the black matrix BM is omitted.

Figure 22:
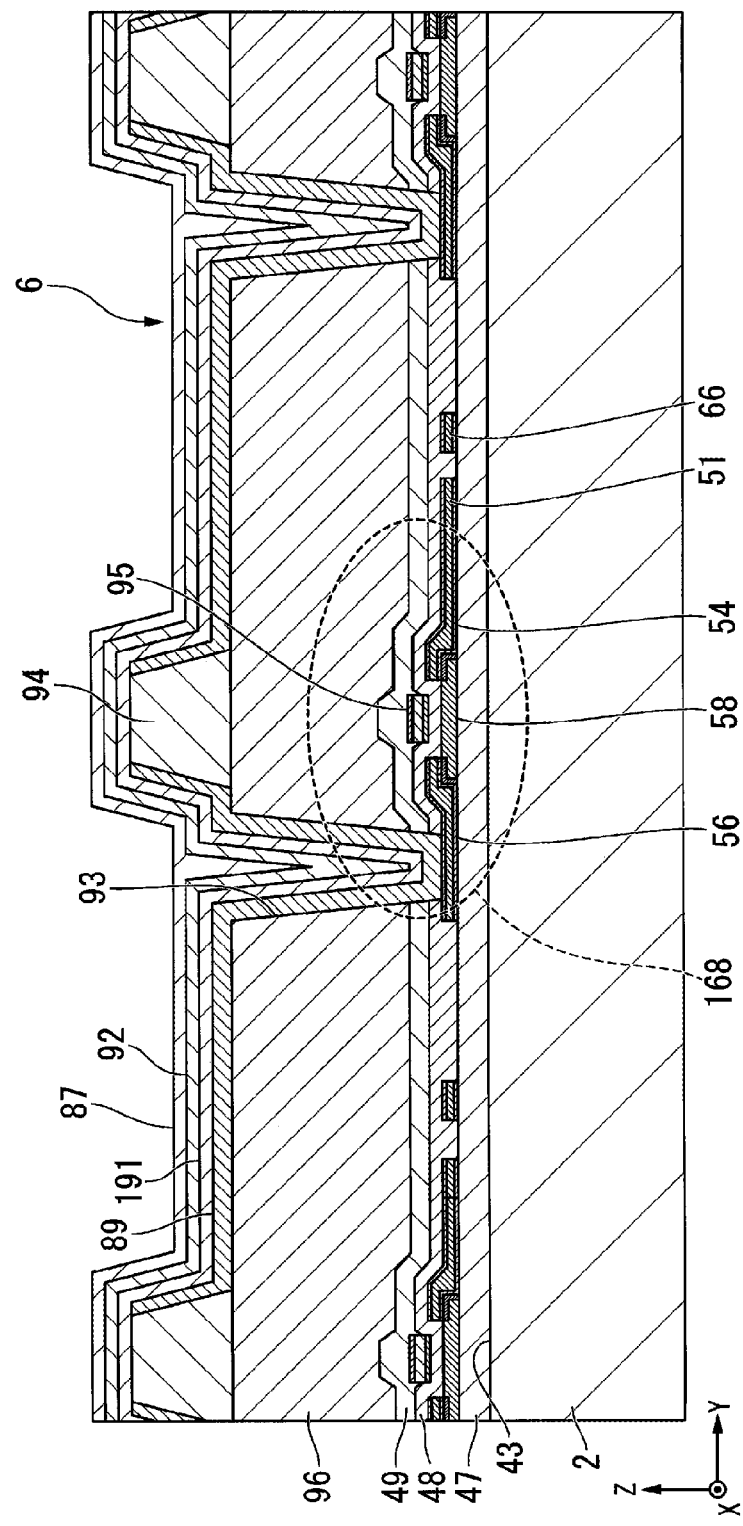
FIG. 22 is an enlarged view partially illustrating the second substrate included in the electronic device according to the second embodiment of the present invention, showing a partial cross-sectional view of a second thin film transistor.

FIG. 22 is an enlarged view partially illustrating the second substrate included in the electronic device E2, showing a partial cross-sectional view of a second thin film transistor, taken along the X direction.

The electronic device E2 includes a display unit having an organic EL element. Specifically, in the electronic device E2, an organic EL light emitting layer is formed as the display functional layer 6 in a pixel opening 97 located between a plurality of banks 94. Further, in FIG. 19, the third substrate 3, and a loop antenna, a secondary battery, and the like associated with the third substrate 3 are omitted. In the second embodiment, the touch sensing unit 10 provided on the second surface 42 of the first substrate 1, and circuits such as the touch driving switching circuit 18 for driving the touch sensing unit 10 are the same as those in the first embodiment. Further, in the second embodiment, circuits such as the gate signal switching circuit 27 provided on the third surface 43 of the second substrate 2 are the same as those in the first embodiment, and the details thereof will not be described.

The touch function driving unit 4 is provided on the second surface 42 of the first substrate 1, and the display functional layer 6 and the like as the organic EL element are provided on the third surface 43 of the second substrate 2. The loop antenna 128, the magnetic layer 131, the secondary battery 124, system control unit 30, and the like are provided on the fifth surface 45 of the third substrate 3. The thin film transistor 168 (first thin film transistor 67 and the second thin film transistor 68) are described later with reference to FIGS. 18 and 22.

The electronic device E2 shown in FIG. 19 includes a frame 107 made of a cushioning material such as one including a metal and a resin. The frame is provided for prevention of chipping and damage of the corners of the substrate or the like. FIG. 20 illustrate arrangement of the loop antenna 128, the secondary battery 124, and the magnetic layer 131 in plan view. Unlike the first embodiment, the second antenna unit 120 and the fourth antenna unit 140 are disposed outside the loop antenna 128 in the second embodiment.

Further, a conductive pattern 248 of the antenna unit according to the second embodiment has a pattern obtained by rotating the conductive pattern 148 of the first embodiment by 180°. Specifically, in the second embodiment, a conductor portion extending in the Y direction in the U-shaped conductive pattern (a conductor portion connecting the ends of two conductor portions extending in the X direction) is located near the loop antenna 128.

Accordingly, a structure is obtained in which a conductive pattern is disposed between the small-diameter loop antenna 164 (165) and the loop antenna 128. With this arrangement, the influence of the loop antenna 128 on the conductive wiring constituting the antenna unit can be reduced.

As shown in FIGS. 19 and 20, the magnetic layer 131 is provided on the fifth surface 45 so as to cover the loop antenna 128. For example, when a metal layer 134 laminated on a package (secondary battery casing) of a lithium battery, which is the secondary battery 124, is disposed at a position near the loop antenna 128, the magnetic layer 131 can be used for improving the antenna efficiency. The magnetic layer 131 has an opening 132 such that the second antenna unit 120 and the fourth antenna unit 140 are provided inside the opening 132. In other words, the second antenna unit 120 and the fourth antenna unit 140 are not covered with the magnetic layer 131. The secondary battery 124 and the system control unit 30 are provided on the magnetic layer 131.

Each of the loop antenna 128, the second antenna unit 120, and the fourth antenna unit 140 are electrically connected to the system control unit 30 via a contact hole or a jump wire or the like (not shown). As with the first embodiment, the small-diameter loop antennas of the first antenna unit 110 and the second antenna unit 120 are superposed on each other in plan view, and the small-diameter loop antennas of the second antenna unit 120 and the fourth antenna unit 140 are superposed on each other in plan view.

As shown in FIG. 20, an opening G can be formed in the third substrate 3, and a CMOS camera or the like can be provided therein. As shown in FIG. 21, the electronic device E2 is an organic EL (organic electroluminescence) display device in which the first substrate 1 and the second substrate 2 are bonded together via an adhesive layer 108, which is a transparent resin.

As shown in FIG. 22, the thin film transistor 168 and the display functional layer 6 are provided on the second substrate 2. The display functional layer 6 is an organic EL element including the light emitting layer 92, a hole injection layer 191, and the like, and the thin film transistor 168 as an active element drives the light emitting layer 92.

As described above, the electronic device E2 according to the embodiment of the present invention can perform transmission and reception of a signal related to touch sensing, and supply and reception of power required for touch sensing between the first substrate 1 and the third substrate 3 via the antenna unit in a wireless manner. Further, transmission and reception of a signal related to driving of the display functional layer and supply and reception of power required for driving of the display functional layer can be performed between the second substrate 2 provided with the thin film transistor array and the third substrate 3 via the antenna unit in a wireless manner.

In addition, communication with the outside of the electronic device 2 and supply of power from an external power supply to the electronic device E2 can be performed by using the loop antenna 128 provided on the third substrate 3.

Electrical connection between the first substrate 1 and the third substrate 3, and electrical connection between the second substrate 2 and the third substrate 3 have been performed by complicated mounting using an FPC connector. On the other hand, the structure of the electronic device E2 can be quite simplified since the electronic device E2 has a function of performing transmission and reception of a signal in a wireless manner, and a function of performing supply and reception of power in a wireless manner, and also adopts a collective sealing structure by the frame region 72, that is, a sealing structure obtained by simply forming a sealing portion 36. In addition, framing by the frame region 72 has an effect of facilitating the mounting between the substrates. By virtue of the collective sealing structure, a high level of waterproof performance can be achieved. Further, a photo-curable or thermosetting resin can be used as a sealant of the sealing portion 36.

In the loop antennas according to the first embodiment and the second embodiment, loop antennas each having a size larger than that of the small-diameter loop antenna, and each wound in directions different from each other (wound in opposite directions) can be arranged adjacent to each other.

It should be noted that the electronic device according to the above embodiments does not exclude the use of a cover glass or a circularly polarizing plate, and these members may be used in the electronic device.

The display device according to the above embodiments can be put into practice in various ways. Examples of electronic devices to which the display device according to the above embodiments are applicable include mobile phones, portable game machines, portable information terminals, personal computers, electronic books, video cameras, digital still cameras, head mounted displays, navigation systems, sound reproduction devices (car audio systems, digital audio players, and the like), copiers, facsimiles, printers, multifunction printers, vending machines, automated teller machines (ATM), personal identification devices, and optical communication devices. The embodiments described above can be used in any combination.

The present invention, in an aspect, provides an electronic device having a display unit capable of touch input with a finger and with a pen, or fingerprint authentication. The present invention, in another aspect, provides an electronic device including a substrate having a touch sensing wiring unit, another substrate having an active element configured to drive a plurality of display functional layers such as light emitting diode elements or a liquid crystal layer, and antennas, wherein transmission and reception of a signal, and supply and reception of power can be performed in a wireless manner. The electronic device further includes a thin, light, and small frame region.

An electronic device according to a first aspect of the present invention includes: a display region and a frame region located around the display region in plan view viewed in an observation direction; a first substrate having a first surface and a second surface; a second substrate having a third surface and a fourth surface; a third substrate having a fifth surface and a sixth surface; and a control unit that controls a touch sensing function, a display function, a communication function, and a wireless charging function, wherein the first substrate, the second substrate, and the third substrate are arranged in this order when viewed in the observation direction, the first substrate transmits light in a visible wavelength range, and is provided with a touch sensing functional layer on the second surface, the touch sensing functional layer including a capacitive touch sensing wiring unit and a first antenna unit, a display functional layer is provided between the second surface and the third surface, the second substrate is provided with a thin film transistor array and a third antenna unit on the third surface, the thin film transistor array being configured to drive the display functional layer, the third substrate is provided with at least a loop antenna, a second antenna unit, and a fourth antenna unit on the fifth surface, the loop antenna being provided with a communication function between an outside and an inside of the electronic device and a wireless charging function from an outside of the electronic device, the first antenna unit and the second antenna unit are superposed on each other in plan view when viewed in the observation direction, and the third antenna unit and the fourth antenna unit are superposed on each other in plan view when viewed in the observation direction.

In the electronic device according to the first aspect of the present invention, the display functional layer may be composed of a plurality of light emitting diode elements.

In the electronic device according to the first aspect of the present invention, the display functional layer may be composed of a plurality of organic EL elements.

In the electronic device according to the first aspect of the present invention, the touch sensing wiring unit may include: a plurality of pieces of first conductive wiring extending in a first direction parallel to each other; an insulating layer; and a plurality of pieces of second conductive wiring extending in a second direction parallel to each other, the second direction being perpendicular to the first direction, the second conductive wiring being stacked on the first conductive wiring with the insulating layer therebetween.

In the electronic device according to the first aspect of the present invention, the electronic device may include a light absorbing layer provided on the first conductive wiring and the second conductive wiring when viewed in the observation direction.

In the electronic device according to the first aspect of the present invention, the first conductive wiring and the second conductive wiring may have a multilayer configuration of two or more layers including at least a copper layer or a copper alloy layer.

In the electronic device according to the first aspect of the present invention, the first conductive wiring and the second conductive wiring may include: at least a copper layer and a copper alloy layer; and a light absorbing layer provided on each of a front surface and a rear surface of the first conductive wiring and the second conductive wiring when viewed in the observation direction.

In the electronic device according to the first aspect of the present invention, the first antenna unit, the second antenna unit, the third antenna unit, and the fourth antenna unit each may have a size smaller than that of the loop antenna; and the first antenna unit, the second antenna unit, the third antenna unit, and the fourth antenna unit may be disposed at positions that are not superposed on the loop antenna when viewed in the observation direction.

In the electronic device according to the first aspect of the present invention, the first antenna unit may include two first loop antennas, each having 2 or more turns and a wiring direction opposite to each other, the second antenna unit may include two second loop antennas, each having 2 or more turns and a wiring direction opposite to each other, a first antenna of the two first loop antennas and another first antenna of the two second loop antennas may be the same in a winding direction, superposed on each other in plan view, and perform transmission and reception of a signal related to touch sensing in a wireless manner, and a second antenna of the two first loop antennas and another second antenna of the two second loop antennas may be the same in a winding direction, superposed on each other in plan view, and perform supply and reception of power required for touch sensing in a wireless manner.

In the electronic device according to the first aspect of the present invention, the third antenna unit may include two third loop antennas, each of the third loop antennas having 2 or more turns and a wiring direction opposite to each other, the fourth antenna unit may include two fourth loop antennas, each of the fourth loop antennas having 2 or more turns and a wiring direction opposite to each other, a third antenna of the two third loop antennas and another third antenna of the two fourth loop antennas may be the same in a winding direction, superposed on each other in plan view, and perform transmission and reception of a signal related to touch sensing in a wireless manner, and a fourth antenna of the two third loop antennas and another fourth antenna of the two fourth loop antennas may be the same in a winding direction, superposed on each other in plan view, and perform supply and reception of power required for touch sensing in a wireless manner.

In the electronic device according to the first aspect of the present invention, the first antenna unit and the second antenna unit may be each partially surrounded by a conductive pattern in plan view, and the third antenna unit and the fourth antenna unit may be each partially surrounded by a conductive pattern in plan view.

In the electronic device according to the first aspect of the present invention, a thin film transistor that constitutes the thin film transistor array may have at least a channel layer formed of an oxide semiconductor.

An electronic device according to a second aspect of the present invention has a configuration as below.

[1] An electronic device comprising: a display region and a frame region located around the display region in plan view viewed in an observation direction; a first substrate having a first surface and a second surface; a second substrate having a third surface and a fourth surface; a third substrate having a fifth surface and a sixth surface; and a control unit that controls a touch sensing function, a display function, a communication function, and a wireless charging function, wherein: the first substrate, the second substrate, and the third substrate are arranged in this order when viewed in the observation direction; the first substrate transmits light in a visible wavelength range, and is provided with a touch sensing functional layer on the second surface, the touch sensing functional layer including a capacitive touch sensing wiring unit and a first antenna unit; the first substrate and the third substrate each have a thickness larger than a thickness of the second substrate; a display functional layer is provided between the second surface and the third surface; the second substrate is provided with a thin film transistor array and a third antenna unit on the third surface, the thin film transistor array being configured to drive the display functional layer; the third substrate is provided with at least a loop antenna, a second antenna unit, and a fourth antenna unit on the fifth surface, the loop antenna being provided with a communication function between an outside and an inside of the electronic device and a wireless charging function from an outside of the electronic device; the first antenna unit and the second antenna unit are superposed on each other in plan view when viewed in the observation direction; the third antenna unit and the fourth antenna unit are superposed on each other in plan view when viewed in the observation direction; and the second substrate is provided with a conductive shield layer on the fourth surface.

[2] The electronic device according to [1], wherein the conductive shield layer includes at least a light absorbing layer and a metal layer.

[3] The electronic device according to [1], wherein the conductive shield layer includes a thermal conductive layer having a thermal conductivity of 100 W/(m·K) or more.

[4] The electronic device according to ill, wherein the first substrate, the second substrate, and the third substrate each have a thermal conductivity of 1 W/(m·K) or more.

[5] The electronic device according to [1], wherein a substrate constituting the first substrate and the third substrate has a Mohs hardness in a range of 6 to 10. According to aspects of the present invention, signals (a touch sensing signal and a power signal) can be transmitted and received in a wireless manner via an antenna unit from the first substrate provided with a touch sensing wiring unit having a multiple pieces of conductive wiring (first conductive wiring and second conductive wiring) to third substrate.

Further, signals (a signal for driving the display functional layer by a thin film transistor, and a power signal) can be transmitted and received in a wireless manner via an antenna unit from the second substrate provided with a thin film transistor array to the third substrate. In addition, communication between the outside and the inside of the electronic device, and supply and reception of power between the electronic device and an external power supply can be performed in a wireless manner by using a loop antenna provided on the third substrate.

Preferred embodiments of the present invention have so far been described. These embodiments are, however, only examples and should not be taken as limiting the invention. Additions, omissions, substitutions, and other changes may be made without departing from the scope of the invention. Accordingly, the invention should not be construed as being limited by the foregoing description, but as being limited by the claims.

REFERENCE SIGNS LIST

1 First substrate
2 Second substrate
3 Third substrate
4 Touch function driving unit
5 Touch sensing wiring unit
6 Display functional layer
7 Display function driving unit
8A First conductive metal oxide layer (Conductive metal oxide layer)
8B Copper alloy layer
8C Second conductive metal oxide layer (Conductive metal oxide layer)
10 Touch sensing unit
13 Third insulating layer
15 Power receiving unit
16 Power supply control unit
17 Touch driving control unit
18 Touch driving switching circuit
19 Touch detection switching circuit
20 Touch signal transmission and reception control unit
21 First conductive wiring (Conductive wiring)
22 Second conductive wiring (Conductive wiring)
23 First light absorbing layer (Light absorbing layer)
24 Second light absorbing layer (Light absorbing layer)
25 Detection and AD conversion unit
26 Source signal switching circuit
27 Gate signal switching circuit
28 Second power receiving unit
29 Video signal receiving unit
30 System control unit
31, 32 Superposed region
34 Conductive shield layer
34A First conductive metal oxide layer (Conductive metal oxide layer)
34B Copper alloy layer
34C Second conductive metal oxide layer (Conductive metal oxide layer)
36 Sealing portion
37 Fourth insulating layer
38 Fifth insulating layer (Insulating layer)
39 Sixth insulating layer
40 Display unit
41 First surface
42 Second surface
43 Third surface
44 Fourth surface
45 Fifth surface
46 Sixth surface
47 Fourth insulating layer
48 Second insulating layer
49 First insulating layer
50, 51 Power supply line
51 First power supply line (Power supply line)
52 Second power supply line (Power supply line)
54 Source electrode
55 Gate electrode
56 Drain electrode
58 Channel layer
59 Second power supply control unit
60, 61 Connection pad
66 Source wiring
67 First thin film transistor (Thin film transistor)
68 Second thin film transistor (Thin film transistor)
69 Gate wiring
71 Effective display region
72 Frame region (Frame section)
74 Overlapping region
75 Auxiliary conductor
76 Transparent conductive film
77 Bonding layer
78 Upper surface
79 Capacitive element
81 Source signal circuit
82 Scan driving circuit
86 Light emitting element
87 Upper electrode
88 Lower electrode
89 Reflective electrode
90 N-type semiconductor layer
91 P-type semiconductor layer
92 Light emitting layer
93 Contact hole
94 Bank
95 Second flattening layer
96 First flattening layer
97 Pixel opening
108 Adhesive layer
109 Sealing layer
110 First antenna unit (Antenna unit)
111, 112, 113, 114, 115, 116, 117, 118 Antenna pair
120 Second antenna unit (Antenna unit)
123 Charge control unit
124 Secondary battery
125 Switching unit
126 NFC communication unit
127 Antenna unit
128 Loop antenna
130 Third antenna unit (Antenna unit)
131 Magnetic layer
132 Opening
134 Metal layer
137, 138, 148, 248 Conductive pattern
140 Fourth antenna unit (Antenna unit)
141, 142 Loop wire
143, 144 Lead wire
150 Cradle
151 Power supply antenna (Antenna)
152 Adapter
153 Third thin film transistor
154 Source electrode
155 Gate electrode
156 Drain electrode
157 Source wiring 158 Channel layer
164, 164A, 1648, 165, 165A, 165B Small-diameter loop antenna
166 Center line
168 Thin film transistor
170 Superposed region
171 Corner
191 Hole injection layer
E1, E2 Electronic device
G Opening
PX Pixel opening (Pixel)

Obviously, numerous modifications and variations of the present invention are possible in light of the above teachings. It is therefore to be understood that within the scope of the appended claims, the invention may be practiced otherwise than as specifically described herein.

What is claimed is:

1. An electronic device, comprising:
    a device body including
        a plurality of substrates including a first substrate, a second substrate, and a third substrate positioned in an order thereof when viewed in an observation direction,
        a plurality of antenna units including a first antenna unit, a second antenna unit, a third antenna unit, and a fourth antenna unit formed such that the first antenna unit and the second antenna unit are positioned on opposite sides of the second substrate and superposed on each other in the plan view when viewed in the observation direction, and that the third antenna unit and the fourth antenna unit are positioned on the opposite sides of the second substrate and superposed on each other in the plan view when viewed in the observation direction,
        a display functional layer formed between the first and second substrates,
        a touch sensing functional layer formed between the first and second substrates, and including a capacitive touch sensing wiring unit and the first antenna unit, and
        a controller formed on the third substrate and configured to control a touch sensing function, a display function, a communication function, and a wireless charging function of the device body,
    wherein the first substrate is configured to transmit visible light,
    the second substrate has a thin film transistor array configured to drive the display functional layer, and has the third antenna unit on a surface thereof, and
    the third substrate has a loop antenna, the second antenna unit, and the fourth antenna unit on a surface thereof such that the loop antenna provides the communication function between an outside and an inside of the electronic device and the wireless charging function from the outside of the electronic device.

2. The electronic device according to claim 1, wherein the display functional layer comprises a plurality of light emitting diode elements.

3. The electronic device according to claim 1, wherein the display functional layer comprises a plurality of organic EL elements.

4. The electronic device according to claim 1, wherein the touch sensing wiring unit includes
    a plurality of first conductive wiring lines extending in parallel in a first direction,
    an insulating layer, and
    a plurality of second conductive wiring lines extending in parallel in a second direction perpendicular to the first direction, and formed on the first conductive wiring with the insulating layer therebetween.

5. The electronic device according to claim 4, further comprising:
    a light absorbing layer formed on the first and second conductive wiring lines when viewed in the observation direction.

6. The electronic device according to claim 4, wherein the first and second conductive wiring lines comprise a plurality of layers including a copper layer or a copper alloy layer.

7. The electronic device according to claim 4, wherein the first and second conductive wiring lines include
    a copper layer or a copper alloy layer, and
    a light absorbing layer formed on both surfaces of each of the first and second conductive wiring lines when viewed in the observation direction.

8. The electronic device according to claim 1, wherein the first, second, third, and fourth antenna units each have a size smaller than a size of the loop antenna, and
    the first, second, third, and fourth antenna units are not superposed on the loop antenna when viewed in the observation direction.

9. The electronic device according to claim 1, wherein the first antenna unit includes two first loop antennas, each having a plurality of turns and a wiring direction opposite to each other,
    the second antenna unit includes two second loop antennas, each having a plurality of turns and a wiring direction opposite to each other,
    one of the two first loop antennas and one of the two second loop antennas are same in a winding direction, superposed on each other in the plan view, and configured to wirelessly transmit and receive a signal for touch sensing, and
    the other of the two first loop antennas and the other of the two second loop antennas are same in a winding direction, superposed on each other in the plan view, and configured to wirelessly supply and receive power for touch sensing.

10. The electronic device according to claim 1, wherein the third antenna unit includes two third loop antennas, each having a plurality of turns and a wiring direction opposite from each other,
    the fourth antenna unit includes two fourth loop antennas, each having a plurality of turns and a wiring direction opposite from each other,
    one of the two third loop antennas and one of the two fourth loop antennas are same in a winding direction, superposed on each other in the plan view, and configured to wirelessly transmit and receive a signal for driving the display functional layer, and
    the other of the two third loop antennas and the other of the two fourth loop antennas are same in a winding direction, superposed on each other in the plan view, and configured to wirelessly supply and receive power for driving the display functional layer.

11. The electronic device according to claim 1, wherein the first antenna unit and the second antenna unit are each partially surrounded by a conductive pattern in the plan view, and the third antenna unit and the fourth antenna unit are each partially surrounded by a conductive pattern in the plan view.

12. The electronic device according to claim 1, wherein the thin film transistor array includes a thin film transistor having a channel layer comprising an oxide semiconductor.

* * * * *